(12) United States Patent
Onoyama

(10) Patent No.: US 10,541,705 B2
(45) Date of Patent: Jan. 21, 2020

(54) DIGITAL/ANALOG CONVERTER CIRCUIT, SOURCE DRIVER, DISPLAY APPARATUS, ELECTRONIC APPARATUS, AND METHOD OF DRIVING A DIGITAL/ANALOG CONVERTER CIRCUIT

(71) Applicant: Sony Corporation, Tokyo (JP)

(72) Inventor: Yusuke Onoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/077,900

(22) PCT Filed: Feb. 15, 2017

(86) PCT No.: PCT/JP2017/005567
§ 371 (c)(1),
(2) Date: Aug. 14, 2018

(87) PCT Pub. No.: WO2017/163678
PCT Pub. Date: Sep. 28, 2017

(65) Prior Publication Data
US 2019/0052283 A1    Feb. 14, 2019

(30) Foreign Application Priority Data
Mar. 23, 2016   (JP) ................. 2016-058185

(51) Int. Cl.
| H03M 1/66 | (2006.01) |
| G09G 3/325 | (2016.01) |
| H03M 1/08 | (2006.01) |
| G09G 3/20 | (2006.01) |
| G09G 3/3233 | (2016.01) |
| H01L 51/50 | (2006.01) |
| G09G 3/36 | (2006.01) |

(52) U.S. Cl.
CPC ............... *H03M 1/66* (2013.01); *G09G 3/20* (2013.01); *G09G 3/325* (2013.01); *G09G 3/3233* (2013.01); *H01L 51/50* (2013.01); *H03M 1/08* (2013.01); *G09G 3/36* (2013.01); *G09G 3/3603* (2013.01); *G09G 3/3614* (2013.01)

(58) Field of Classification Search
CPC ......... H03M 1/66; G09G 3/36; G09G 3/3603; G09G 3/3614
USPC ............. 341/144, 145; 345/690, 87, 89, 209
See application file for complete search history.

(56) References Cited

U.S. PATENT DOCUMENTS

| 4,384,277 A | 5/1983 | Allgood et al. |
| 9,019,321 B2 * | 4/2015 | Lee ............. G09G 5/10 |
| | | 345/690 |
| 2014/0266836 A1 * | 9/2014 | Price ............ H03M 1/0602 |
| | | 341/145 |

FOREIGN PATENT DOCUMENTS

| JP | 07-046128 A | 2/1995 |
| JP | 11-136130 A | 5/1999 |

(Continued)

*Primary Examiner* — Joseph J Lauture
(74) *Attorney, Agent, or Firm* — Michael Best & Friedrich LLP

(57) ABSTRACT

A digital/analog converter circuit includes: a decoding unit that performs decoding processing on a bit signal in a predetermined part of a digital signal; and a selector circuit that selects and outputs a voltage depending on an output of the decoding unit, in which a switching device is disposed on at least one of inside of the decoding unit and an output unit side of the decoding unit, the switching device being controlled by a control signal different from the hit signal as a target for the decoding processing.

14 Claims, 32 Drawing Sheets

(56) References Cited

FOREIGN PATENT DOCUMENTS

| | | | |
|---|---|---|---|
| JP | 2003-233355 | A | 8/2003 |
| JP | 2008-026595 | A | 2/2008 |
| JP | 2008-122899 | A | 5/2008 |
| JP | 2010-020292 | A | 1/2010 |
| JP | 2010-109977 | A | 5/2010 |

* cited by examiner

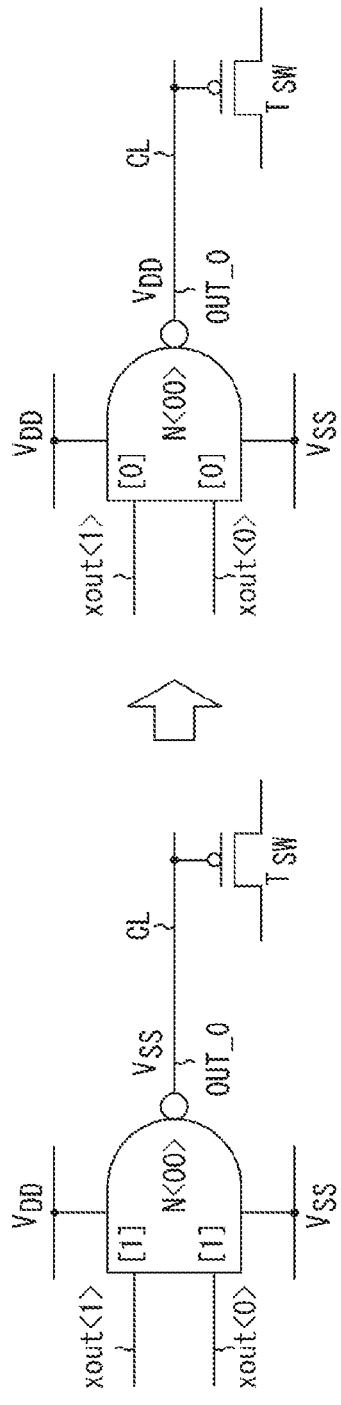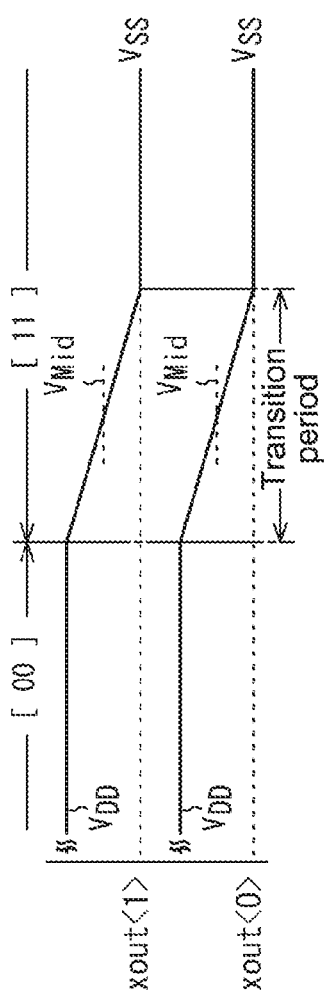
FIG. 12A
FIG. 12B
FIGS. 12

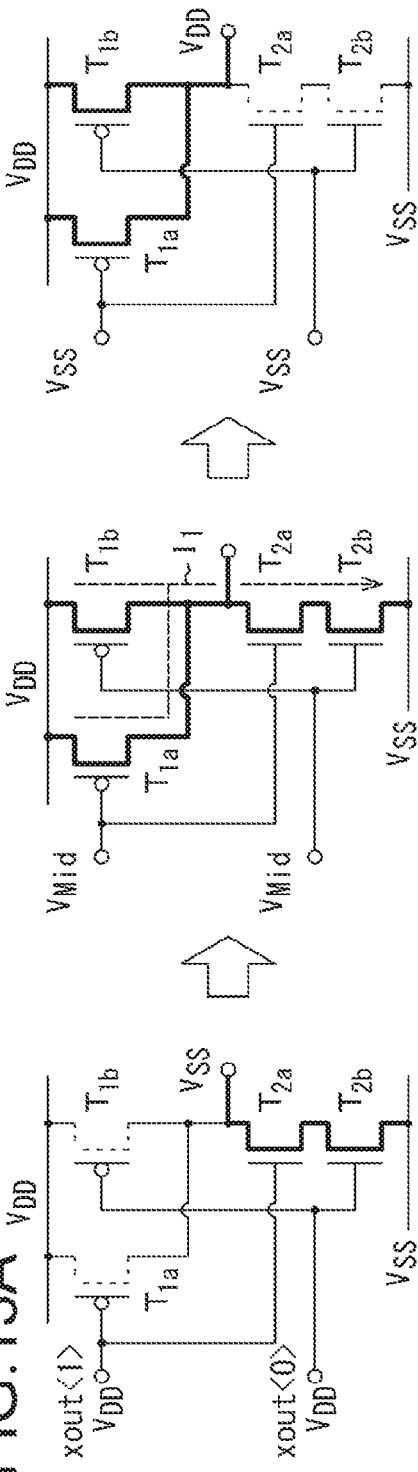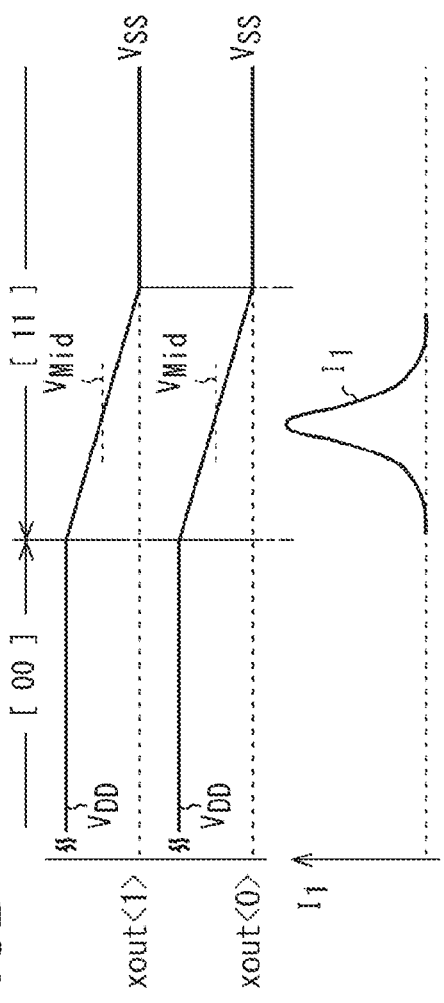
FIG. 13A
FIG. 13B
FIGS. 13

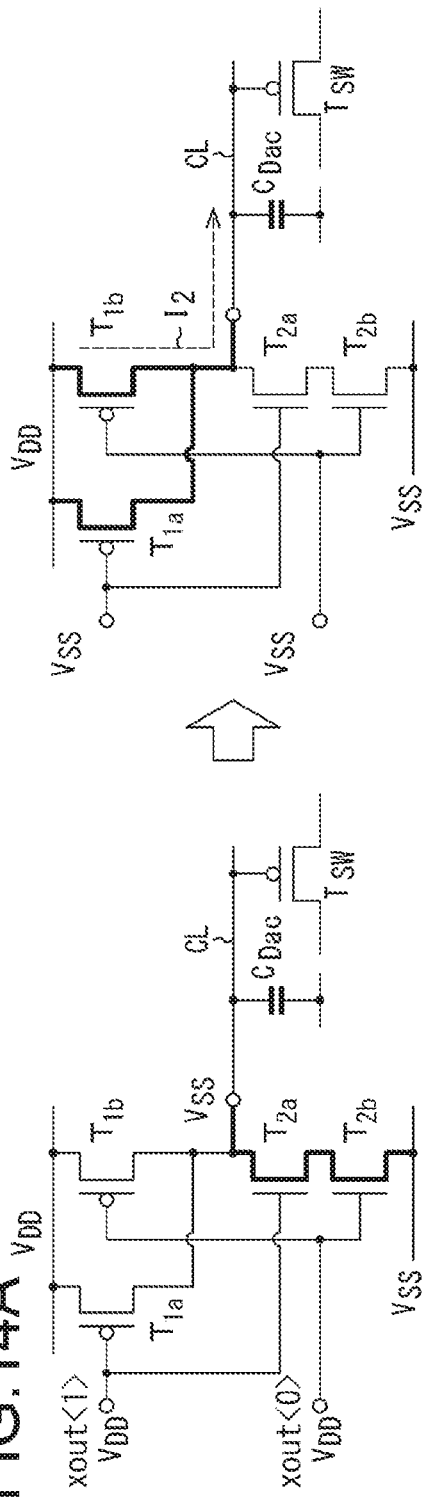
FIG. 14A
FIG. 14B
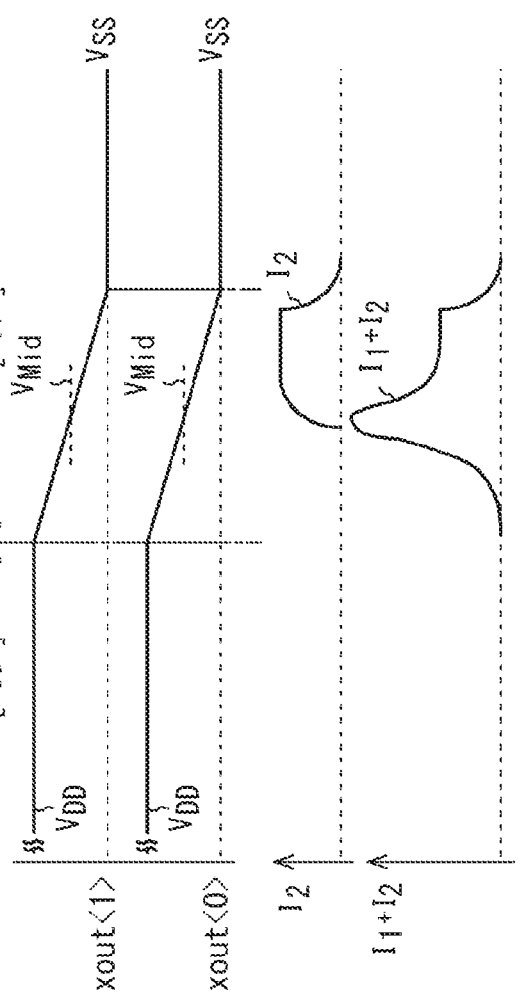
FIGS. 14

FIG.16A
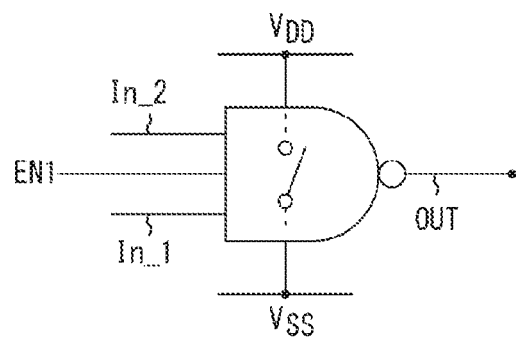
FIG.16B
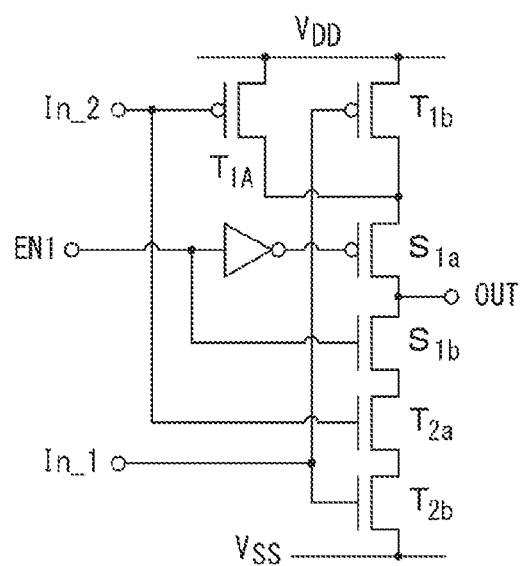
FIGS.16

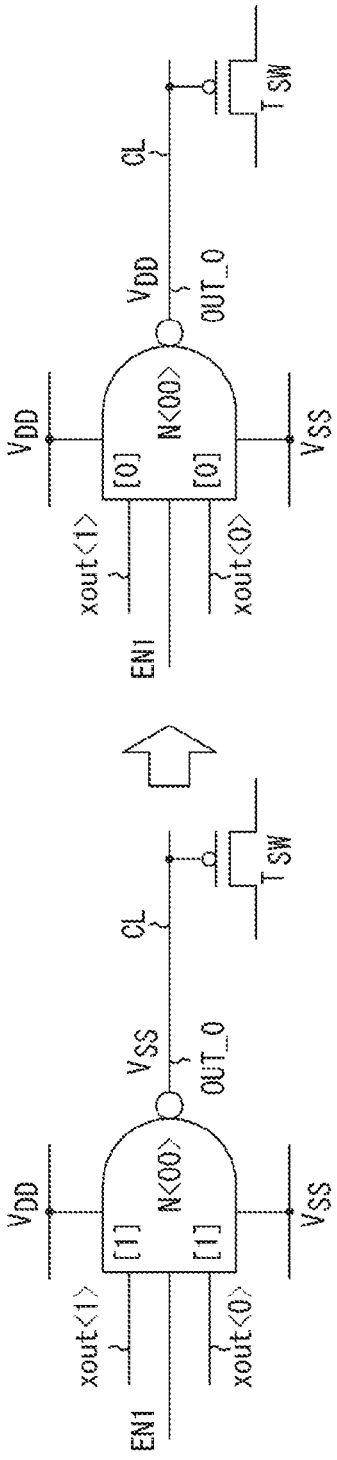
FIG. 17A
FIG. 17B
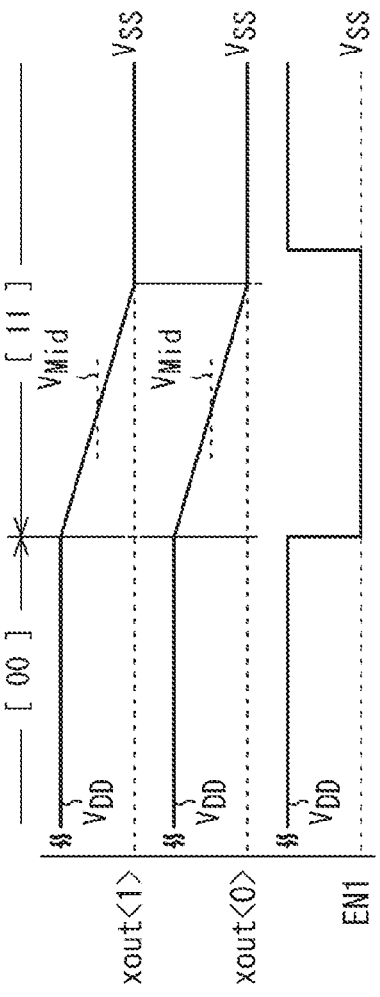
FIGS. 17

FIG.30A
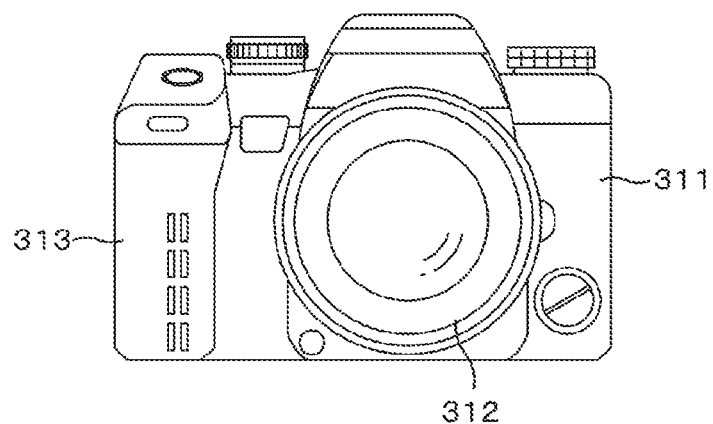
FIG.30B
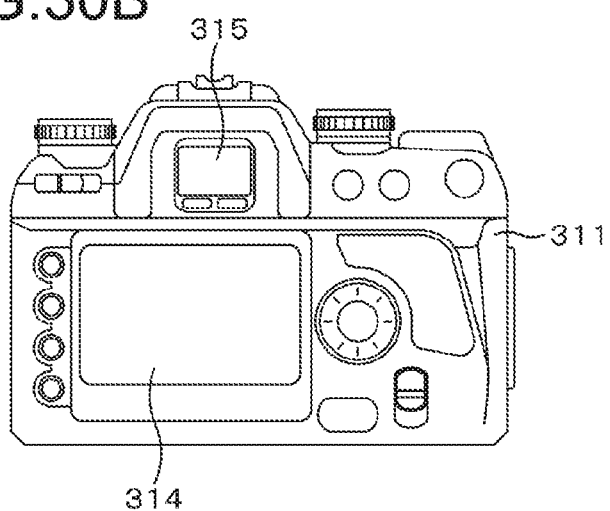
FIGS.30

DIGITAL/ANALOG CONVERTER CIRCUIT, SOURCE DRIVER, DISPLAY APPARATUS, ELECTRONIC APPARATUS, AND METHOD OF DRIVING A DIGITAL/ANALOG CONVERTER CIRCUIT

TECHNICAL FIELD

The present disclosure relates to a digital/analog converter circuit, a source driver, a display apparatus, an electronic apparatus, and a method of driving the digital/analog converter circuit.

BACKGROUND ART

In display apparatuses including display units in which electroluminescence display devices or liquid crystal display devices are arranged, in order to display images, a source driver that supplies to data lines a voltage corresponding to a gradation value supplied as a digital signal is used. For example, as disclosed in Japanese Patent Application Laid-open No. 2003-233355 (Patent Literature 1) or the like, there is known a source driver including a digital/analog converter circuit that outputs a voltage corresponding to a gradation value and an amplifier circuit that drives a data line on the basis of the output of the digital/analog converter circuit.

CITATION LIST

Patent Literature

Patent Literature 1: Japanese Patent Application Laid-open No. 2003-233355

DISCLOSURE OF INVENTION

Technical Problem

In recent years, in also a small-sized display apparatus, high definition is being achieved. For example, a display unit and a driving unit including a source driver are integrally arranged on a silicon substrate. In such a configuration, it is necessary to suppress the width of the area occupied by the source driver to substantially the same width as that of the area of the display unit, for example. As described, also the source driver used in the display apparatus is required to be miniaturized.

The source driver includes a level shifter that increases the voltage of a digital signal, a digital/analog converter circuit that selects and output a voltage corresponding to a gradation value given by the digital signal, and the like. The digital/analog converter circuit in such a mode that selects and outputs the voltage corresponding to a gradation value typically includes a large number of switching devices, and has a large circuit scale. By using a decoding-type digital/analog converter circuit capable of reducing the number of switching devices, it is possible to reduce the circuit scale and miniaturize the source driver. However, it is conceivable that noise caused by the operation of the source driver affects a displayed image.

Therefore, it is an object of the present disclosure is to provide a digital/analog converter circuit, a source driver including such a digital/analog converter circuit, a display apparatus including such a source driver, an electronic apparatus including such a display apparatus, and a method of driving the digital/analog converter circuit that are capable of reducing noise caused by the operation.

Solution to Problem

A digital/analog converter circuit according to a first aspect of the present disclosure so as to achieve the object described above is a digital/analog converter circuit, including:

a decoding unit that performs decoding processing on a bit signal in a predetermined part of a digital signal; and a selector circuit that selects and outputs a voltage depending on an output of the decoding unit, in which a switching device is disposed on at least one of inside of the decoding unit and an output unit side of the decoding unit, the switching device being controlled by a control signal different from the bit signal as a target for the decoding processing.

A source driver according to the first aspect of the present disclosure so as to achieve the object described above is a source driver that is used for supplying a voltage corresponding to a gradation value given as a digital signal to a data line of a display unit, the source driver including:

a digital/analog converter circuit that selects and outputs the voltage corresponding to the gradation value, the digital/analog converter circuit including a decoding unit that performs decoding processing on a bit signal in a predetermined part of a digital signal, and a selector circuit that selects and outputs a voltage depending on an output of the decoding unit, in which a switching device is disposed on at least one of inside of the decoding unit and an output unit side of the decoding unit, the switching device being controlled by a control signal different from the bit signal as a target for the decoding processing.

A display apparatus according to the first aspect of the present disclosure so as to achieve the object described above is a display apparatus, including:

a display unit; and a source driver that is used for supplying a voltage corresponding to a gradation value given as a digital signal to a data line of a display unit, the source driver including a digital/analog converter circuit that selects and outputs the voltage corresponding to the gradation value, the digital/analog converter circuit including a decoding unit that performs decoding processing on a bit signal in a predetermined part of a digital signal, and a selector circuit that selects and outputs a voltage depending on as output of the decoding unit, in which a switching device is disposed on at least one of inside of the decoding unit and as output unit side of the decoding unit, the switching device being controlled by a control signal different from the bit signal as a target for the decoding processing.

An electronic apparatus according to the first aspect of the present disclosure so as to achieve the object described above is as electronic apparatus, including:

a display apparatus including a display unit, and a source driver that is used for supplying a voltage corresponding to a gradation value given as a digital signal to a data line of a display unit, the source driver including a digital/analog converter circuit that selects and outputs the voltage corresponding to the gradation value, the digital/analog converter circuit including
a decoding unit that performs decoding processing on a bit signal in a predetermined part of a digital signal, and
a selector circuit that selects and outputs a voltage depending on an output of the decoding unit, in which
a switching device is disposed on at least one of inside of the decoding unit and an output unit side of the decoding unit, the switching device being controlled by a control signal different from the bit signal as a target for the decoding processing.

A method of driving a digital/analog converter circuit according to the first aspect of the present disclosure so as to achieve the object described above is a method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method including:

performing, when an output of the NAND gate transits, control of blocking a path between a power supply voltage side in an output circuit of the NAND gate and a ground voltage side.

A method of driving a digital/analog converter circuit according to a second aspect of the present disclosure so as to achieve the object described above is a method of driving a digital/analog converter circuit including a decoding unit that performs decoding processing on a bit signal in a predetermined part of a digital signal, and a selector circuit that selects and outputs a voltage depending on an output of the decoding unit, the method including:

performing, when the output of the decoding unit transits, control of short-circuiting a corresponding control line of the selector circuit while an output unit of the decoding unit and the control line of the selector circuit are disconnected.

A method of driving a digital/analog converter circuit according to a third aspect of the present disclosure so as to achieve the object described above is a method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method including:

performing, when an output of the NAND gate transits, control of blocking a path between a power supply voltage side in an output circuit of the NAND gate and a ground voltage side, and control of short-circuiting a corresponding control line of the selector circuit while an output unit of the decoding unit and the control line of the selector circuit are disconnected.

Advantageous Effects of Invention

In the digital/analog converter circuit according to the present disclosure, a switching device is disposed on at least one of inside of the decoding unit and an output unit side of the decoding unit, the switching device being controlled by a control signal different from the bit signal as a target for the decoding processing. This makes it possible to reduce the change of current when the output of the decoding unit transits. Further, the voltage change of a power supply line or a grounded line is suppressed. The same applies to the method of driving the digital/analog converter circuit according to the present disclosure. As a result, it is possible to reduce noise caused by the operation. In the source driver including the digital/analog converter circuit according to the present disclosure, the display apparatus including such a source driver, and the electronic apparatus including such a display apparatus, the noise in a display screen due to the voltage change of the power supply line or the grounded line is reduced. Further, the effects disclosed herein are merely exemplary ones and are not restrictive ones, and additional effects may be produced.

BRIEF DESCRIPTION OF DRAWINGS

FIG. 12A is a schematic circuit diagram for describing an operation when the lower two bits of the video signal shift from [00] to [11] in a NAND gate that operates so as to select a voltage $VG_0$ in the case where the lower two bits of the video signal are [00]. FIG. 12B is a schematic timing chart for describing an input signal of the NAND gate when the lower two bits of the video signal shift from [00] to [11].

FIG. 13A is a schematic circuit diagram for describing a through current flowing to the NAND gate in a transition period when the lower two bits of the video signal shift from [00] to [11]. FIG. 13B is a schematic timing chart and graph for describing the through current flowing to the NAND gate in the transition period.

FIG. 14A is a schematic circuit diagram for describing a current flowing from the output of the NAND gate that operates so as to select the voltage $VG_0$ in the case where the lower two bits of the video signal are [00] when the lower two bits of the video signal shift from [00] to [11] in the NAND gate. FIG. 14B is a schematic timing chart and graph for describing the current flowing from the output of the NAND gate in the transition period.

FIG. 16A is a schematic diagram of the NAND gate used in the source driver according to the first embodiment. FIG. 16B is a schematic circuit diagram of the NAND gate shown in FIG. 16A.

FIG. 17A is a schematic circuit diagram for describing an operation when the lower two bits of the video signal shifts from [00] to [11] in the NAND gate that operates so as to select a voltage $VG_0$ in the case where the lower two bits of the video signal are [00]. FIG. 17B is a schematic timing chart for describing an input signal of the NAND gate when the lower two bits of the video signal shift from [00] to [11].

FIG. 30 is an outer appearance view of a digital still camera of a lens-interchangeable and single-lens-reflex type, in which FIG. 30A shows a front view thereof and FIG. 30B shows a rear view thereof.

MODE (S) FOR CARRYING OUT THE INVENTION

Figure 1:
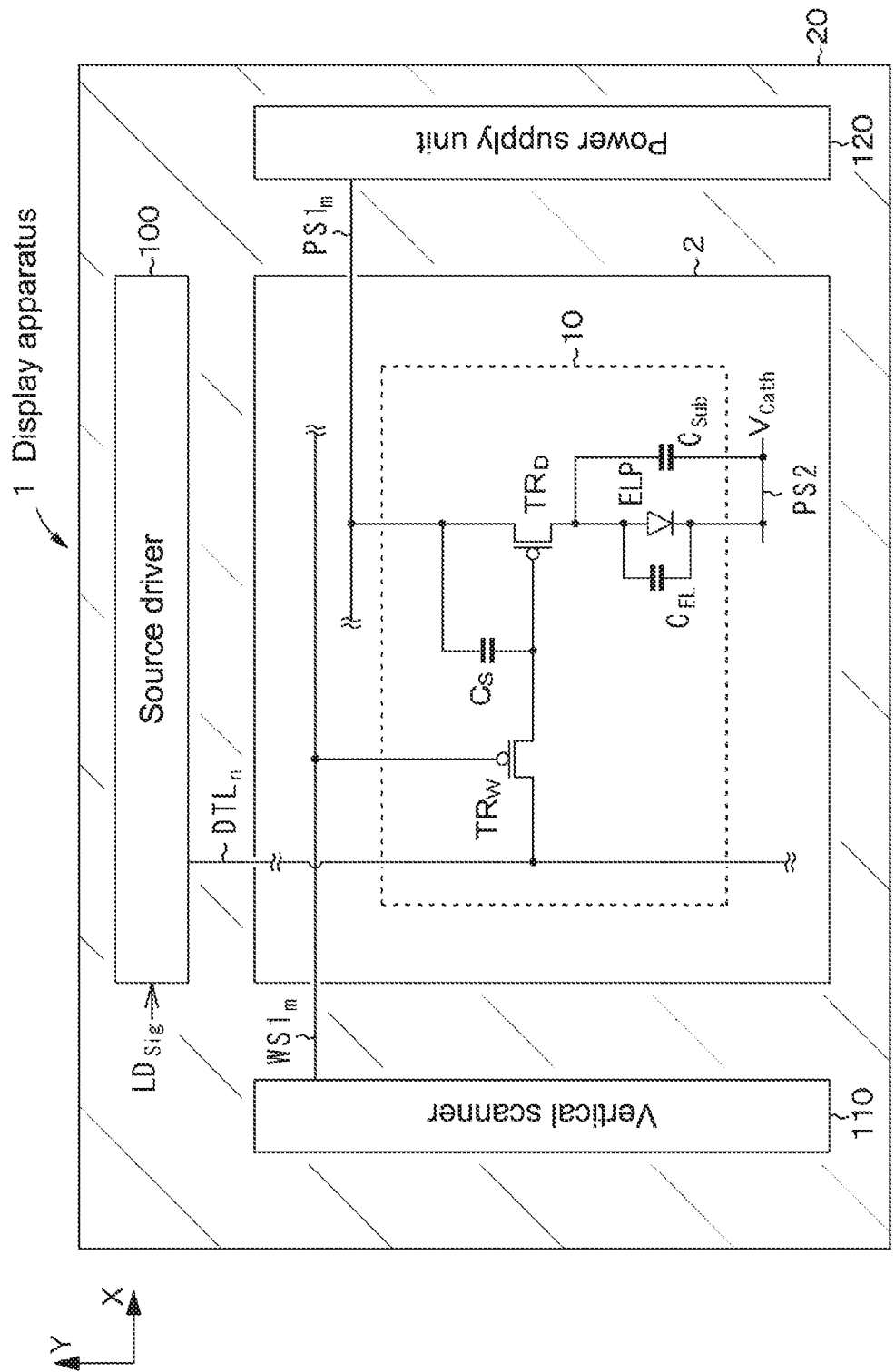
FIG. 1 is a conceptual diagram of a display apparatus according to a first embodiment.

Hereinafter, the present disclosure will be described on the basis of embodiments with reference to the drawings. The present disclosure is not limited to the embodiments, and various numerical values or materials in the embodiments are examples. In the following description, the same devices or devices having the same function are denoted by the same reference symbols, and overlapping description will be omitted. Note that the description will be given in the following order.

1. General description regarding digital/analog converter circuit, source driver, display apparatus, electronic apparatus, and method of driving digital/analog converter circuit according to present disclosure
2. First embodiment
3. Second embodiment
4. Third embodiment
5. Description of electronic apparatus and others

[General Description Regarding Digital/Analog Converter Circuit, Source Driver, Display Apparatus, Electronic Apparatus, and Method of Driving Digital/Analog Converter Circuit According to Present Disclosure]

In a digital/analog converter circuit according to the first aspect of the present disclosure, a digital/analog converter circuit provided in a source driver according to the first aspect of the present disclosure, a digital/analog converter circuit provided in a source driver used in a display apparatus and as electronic apparatus according to the first aspect of the present disclosure, and a digital/analog converter circuit used in a method of driving the digital/analog converter circuit according to the first aspect to the third aspect of the present disclosure (hereinafter, simply referred to as digital/analog converter circuit according to the first aspect of the present disclosure in some cases), the decoding unit may include a NAND gate, and a first switching device may be connected in series to a path between a power supply voltage side in an output circuit of the NAND gate and a ground voltage side.

In this case, a pair of switching devices may be disposed as the first switching device in the NAND gate, one of the pair of switching devices may be connected in series to a part between an output end of the output circuit and the power supply voltage side, and the other of the pair of switching devices may be connected is series to a part between the output end of the output circuit and the ground voltage side.

In this case, the pair of switching devices may be controlled by the same control signal.

In the digital/analog converter circuit according to the first aspect of the present disclosure including various favorable configurations described above, the decoding unit may include a plurality of units each including a pair of NAND gates capable of performing two bit processing, the plurality of units being arrayed in the decoding unit.

In the digital/analog converter circuit according to the first aspect of the present disclosure including various favorable configurations described above, when an output of the NAND gate transits, the first switching device may be controlled by the control signal to block the path between the power supply voltage side in the output circuit and the ground voltage side.

In the digital/analog converter circuit according to the first aspect of the present disclosure including various favorable configurations described above, on the output unit side of the decoding unit, second switching devices and third switching devices may be disposed corresponding to respective control lines of the selector circuit corresponding to the decoding unit, the output unit of the decoding unit may be connected to the control line of the selector circuit corresponding to the decoding unit via the corresponding second switching device, and the control lines of the selector circuit may be connected to each other via the third switching devices.

In this case, when the output of the decoding unit transits, each of the second switching devices and the third switching devices may be controlled by the control signal to short-circuit the corresponding control line of the selector circuit while the output unit of the decoding unit and the control line of the selector circuit are disconnected.

In the display apparatus according to the first aspect of the present disclosure or the display apparatus used in the electronic apparatus according to the first aspect of the present disclosure, the display unit and the source driver may be configured separately from each other. Alternatively, the display unit and the source driver may be integrally configured. Note that in the present disclosure, since the circuit scale of the source driver can be reduced, the display unit and the source driver are suitable for application to a configuration in which there are integrally formed on a common semiconductor substrate.

Hereinafter, the digital/analog converter circuit, the source driver, the display apparatus, the electronic apparatus, and the method of driving the digital/analog converter circuit according to the present disclosure are simply referred to as the present disclosure in some cases.

The source driver may have a configuration in which the constituent parts are integrated to be one or are configured as separate parts appropriately. Those parts can be configured by using well-known circuit devices. Note that a vertical scanner or a power supply unit shown in FIG. 1 can also be configured by using well-known circuit devices.

A well-known display unit such as a liquid crystal display unit or an electroluminescence display unit can be exemplified as a display unit used in the display apparatus of the present disclosure. The configuration of the display unit is not particularly limited as long as there is no trouble in the operation of the display apparatus.

In use application where reduction in size is requested, such as a display unit for a head mounted display or viewfinder, it is desirable to provide a configuration in which the display unit and the source driver are formed on the same substrate.

The display unit may have a so-called monochrome display configuration or may have a color display configuration. In the case of the color display configuration, a single pixel can have a configuration including a plurality of sub-pixels, i.e., a single pixel can have a configuration including a set of a red-color display device, a green-color display device, and a blue-color display device. Furthermore, a single pixel can also have a configuration including a set of those three display devices and one or more types of display devices.

Examples of pixel values of the display unit include, in addition to U-XGA (1600, 1200), HD-TV (1920, 1080), and Q-XGA. (2048, 1536), some of image display resolutions such as (3840, 2160) and (7680, 4320), but the present disclosure is not limited to those values.

Various conditions in this specification are satisfied when mathematically precisely established and also substantially established. The presence of variations generated in the design or production is permitted.

In a timing chart used in the following description, the length (time length) of the horizontal axis representing each period is schematic and does not represent the percentage of the time length of each period. The same holds true for the vertical axis. Further, the shape of waveforms in the timing chart is also schematic.

First Embodiment

The first embodiment relates to a digital/analog converter circuit, a source driver, a display apparatus, and a method of driving a digital/analog converter circuit according to the first aspect of the present disclosure.

FIG. 1 is a conceptual diagram of a display apparatus according to a first embodiment. A display apparatus 1 includes a display unit 2 and a source driver 100. The display unit 2 includes display devices 10 arrayed in a two-dimensional matrix while being connected to scanning lines WS1 extending in a row direction (in FIG. 1, X direction) and to data lines DTL extending in a column direction (in FIG. 1, Y direction). The source driver 100 is used for supplying a voltage corresponding to the gradation value given as a digital signal to the data lines DTL of the display unit 2.

The display apparatus 1 further includes a vertical scanner 110 and a power supply unit 120. A scanning signal is supplied from the vertical scanner 110 to the scanning lines WS1. Note that, for convenience of illustration, FIG. 1 shows a wiring relationship regarding a single display device 10, more specifically, a (n, m)-th display device 10 to be described later.

The display unit 2 and the source driver 100 are formed on a semiconductor substrate 20 formed of silicon. Note that similarly to the source driver 100, also the vertical scanner 110 and the power supply unit 120 are formed on the semiconductor substrate 20. That is, the display apparatus 1 is a display apparatus integrated with a driving circuit.

The display unit 2 further includes feeder lines PS1 connected to the display devices 10 arranged in the row direction and a common feeder line PS2 connected commonly to all the display devices 10. A predetermined drive voltage is supplied from a power supply unit 120 to the feeder lines PS1 so as to correspond to the scanning of the scanning lines WS1. Meanwhile, a common voltage $V_{cath}$ (e.g., ground potential) is constantly supplied to the common feeder in PS2.

Although not shown in FIG. 1, a region where the display unit 2 displays an image (display region) includes the N display devices 10 in the row direction by the M display devices 10 in the column direction, a total of N*M display devices 10 arrayed in a two-dimensional matrix. The number of rows of the display devices 10 in the display region is N, and the number of display devices 10 forming each row is N.

Further, the number of scanning lines WS1 and the number of feeder lines PS1 are each M. The display devices 10 in the m-th row (where m=1, 2, . . . , M) are connected to the m-th scanning line $WS1_m$ and the m-th feeder line $PS1_m$ and form a single display device row. Note that FIG. 1 shows only the feeder line $PS1_m$.

Further, the number of data lines DTL is N. The display devices 10 in the n-th column (where n=1, 2, . . . , N) are connected to the n-th data line $DTL_n$. Note that FIG. 1 shows only the data line $DTL_n$.

Figure 3:
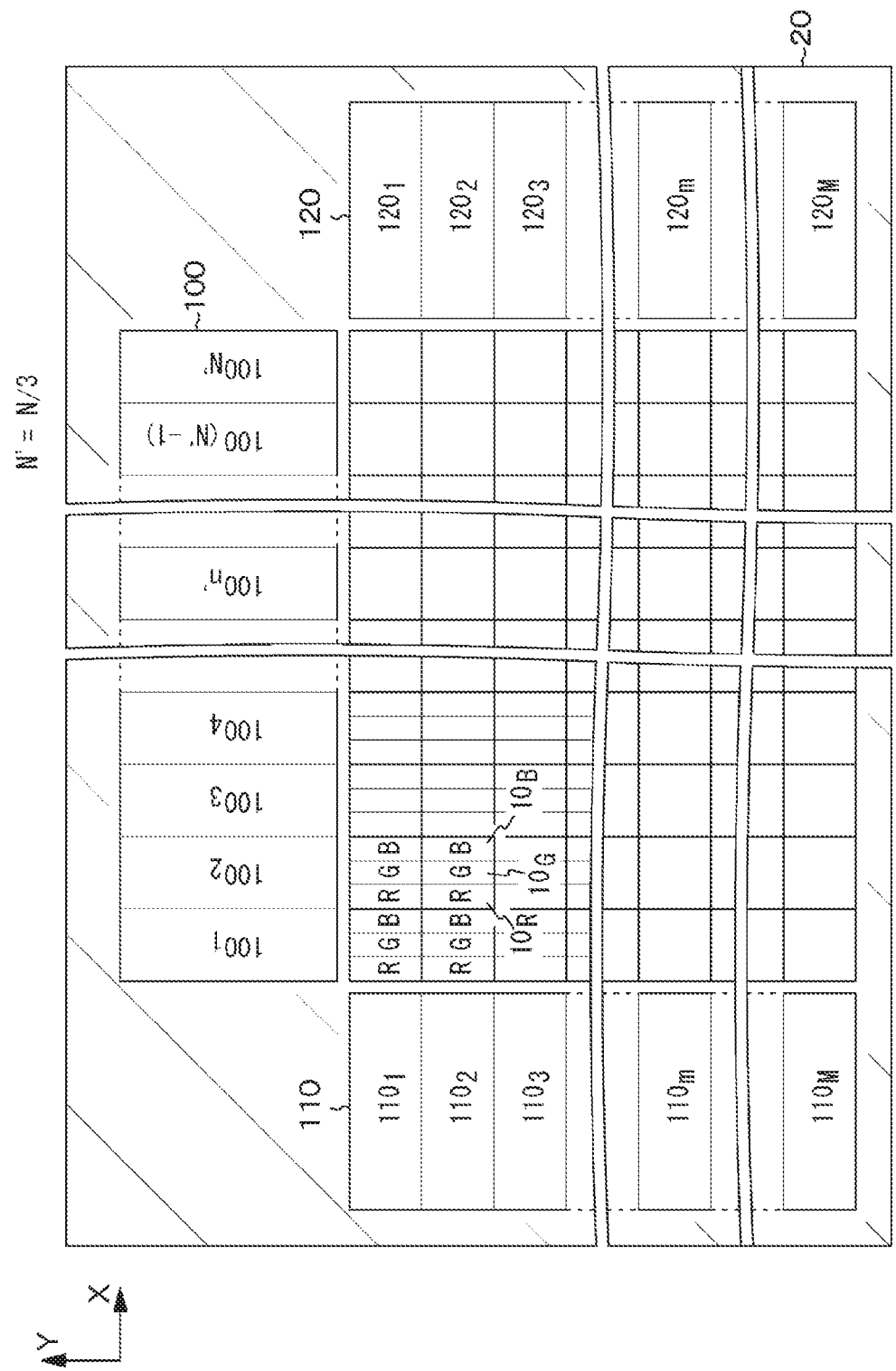
FIG. 3 is a schematic diagram for describing an arrangement relationship between the display unit, a source driver, a vertical scanner, and a power supply unit on a semiconductor substrate.

The display apparatus 1 is, for example, a display apparatus for color display, in which a group including three display devices 10 arranged in the row direction form a single pixel. As shown in FIG. 3 to be described later, a group including a red-color display device $10_R$, a green-color display device $10_G$, and a blue-color display device $10_B$ form a single pixel. Therefore, in the case where N'=N/3, N' pixels in the row direction and M pixels in the column direction, i.e., a total of N'×M pixels are arrayed in the display unit 2.

The display apparatus 1 is line-sequentially scanned on a row-by-row basis by the scanning signal from the vertical scanner 110. The display device 10 positioned in the m-th row and the n-th column is hereinafter referred to as the (n, m)-th display device 10 or the (n, m)-th pixel.

In the display apparatus 1, the N display devices 10 arrayed in the m-th row are simultaneously driven. In other words, in the N display devices 10 arranged along the row direction, a light emitting/non-light emitting timing thereof is controlled for each row to which those N display devices 10 belong. Assuming that a display frame rate of the display apparatus 1 is represented by FR (number of times/seconds), a scanning interval (so-called horizontal scanning interval) per row when the display apparatus 1 is line-sequentially scanned on a row-by-row basis is less than (1/FR)*(1/M) seconds.

To the source driver 100, a video signal $LD_{Sig}$ representing a gradation corresponding to an image to be displayed is input from, for example, an apparatus that is not shown in the figure. The video signal $LD_{Sig}$ is a low voltage digital signal having a crest value of, for example, approximately 1.8 volts. The source driver 100 of the display apparatus 1 is a source driver used for supplying a voltage corresponding to a gradation value of the video signal $LD_{Sig}$ to the data lines art of the display unit 2.

Among the input video signals $LD_{Sig}$, a signal corresponding to the (n, m)-th display device 10 is represented by $LD_{Sig(n, m)}$. In the following description, a gradation bit number of the video signal $LD_{Sig}$ is assumed to be 8 bits, but the gradation bit number is not limited thereto. For example, a configuration having a bit number such as 12 bits, 16 bits, or 24 bits may be employed.

The source driver 100 generates an analog signal corresponding to the gradation value of the video signal $LD_{Sig}$ and supplies the resultant signal to the data lines DTL. The analog signal to be generated is a signal having a crest value of, for example, approximately 10 volts to 20 volts, which is a high voltage with respect to the video signal $LD_{Sig}$.

The display device 10 disposed on the display unit 2 at least includes a current-driven light-emitting unit ELP, a storage capacitor $C_S$ that holds the voltage supplied from the data lines DTL, a drive transistor $TR_D$ that provides a current corresponding to the voltage held by the storage capacitor $C_S$ to the light-emitting unit ELP, and further includes a write transistor $TR_W$.

The light-emitting unit ELP is a current-driven electro-optic device whose light emission luminance changes according to the value of a flowing current. Specifically, the light-emitting unit ELP is formed of an organic electroluminescence device. The light-emitting unit ELP has a well-known configuration or structure including an anode electrode, a hole transport layer, a light-emitting layer, an electron transport layer, a cathode electrode, and the like.

Each transistor of the display device 10 will be described as a p-channel field-effect transistor, but the present disclosure is not limited thereto.

The storage capacitor $C_S$ is used for holding a voltage of a gate electrode to a source region of the drive transistor $TR_D$ (i.e., gate-source voltage). In a light-emitting state of the display device 10, one source/drain region of the drive transistor $TR_D$ (in FIG. 1, the side connected to the feeder line PS1) works as a source region, and the other source/drain region thereof works as a drain region. One electrode and the other electrode of the storage capacitor $C_S$ are each connected to the one source/drain region and the gate electrode of the drive transistor $TR_D$. The other source/drain region of the drive transistor $TR_D$ is connected to the anode electrode of the light-emitting unit ELP.

The write transistor $TR_W$ includes a gate electrode connected to the scanning line WS1, one source/drain region connected to the data line DTL, and the other source/drain region connected to the gate electrode of the drive transistor $TR_D$.

The other end of the light-emitting unit ELP (specifically, cathode electrode) is connected to the common feeder line PS2. A predetermined voltage $V_{cath}$ is supplied to the common feeder line PS2. Note that a capacitor of the light-emitting unit ELP is represented by a reference symbol $C_{EL}$. In a case where the capacitor $C_{EL}$ of the light-emitting unit ELP is small and thus a trouble occurs when the display device 10 is driven, an auxiliary capacitor $C_{Sub}$ connected in parallel with the light-emitting unit ELP may be provided as needed. An example in which the auxiliary capacitor $C_{Sub}$ is provided is shown in the figure, but it is merely an example.

In a state where a voltage corresponding to the luminance of an image to be displayed is supplied from the source driver 100 to the data lines DTL and when the write transistor $TR_W$ enters a conductive state by the scanning signal from the vertical scanner 110, a voltage corresponding to the gradation value of the image to be displayed is written in the storage capacitor $C_S$. After the write transistor $TR_W$ enters a non-conductive state, the current flows in the drive transistor $TR_D$ according to the voltage held in the storage capacitor $C_S$, and the light-emitting unit ELP emits light.

Figure 2:
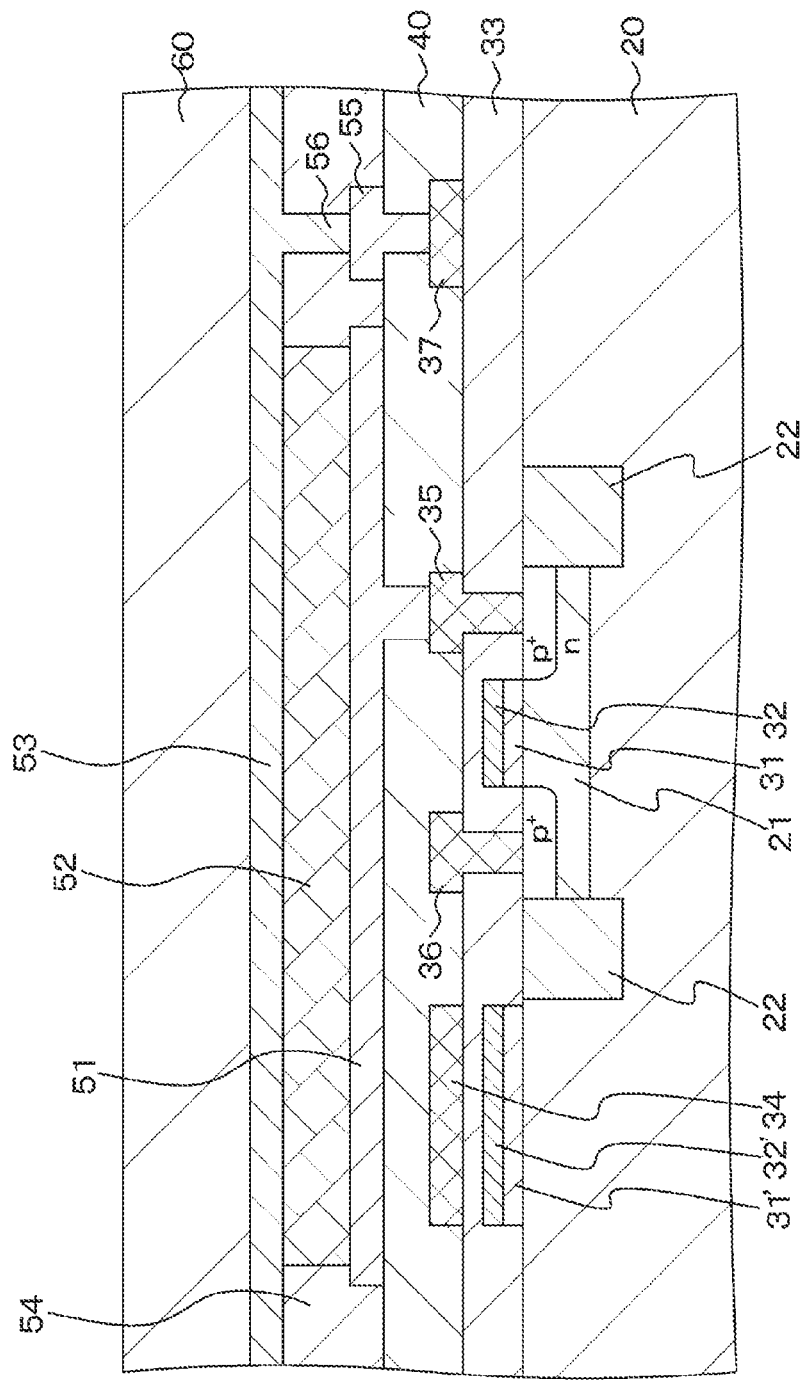
FIG. 2 is a schematic partial cross-sectional view of a part including a display device in a display unit.

Here, an arrangement relationship between the light-emitting unit ELP, the transistors, and the like will be described. FIG. 2 is a schematic partial cross-sectional view of a part including the display device in the display unit.

Each transistor constituting the display device 10 is provided to an n-well 21 formed on the surface of the semiconductor substrate 20 formed of silicon. Note that for convenience of illustration, only the drive transistor $TR_D$ is shown in the figure. These transistors are surrounded by a device separation area 22. A reference symbol 32 represents the gate electrode of the drive transistor $TR_D$, and a reference symbol 31 represents the gate insulating layer.

The other electrode 32' constituting the storage capacitor $C_S$ includes the same material layer as the layer of the gate electrode 32, and is formed on an insulating layer 31' including the same material layer as that of the gate insulating layer 31. An interlayer insulating layer 33 is formed on the entire surface of the semiconductor substrate 20 including the gate electrode 32 of the drive transistor $TR_D$ and the electrode 32'. The electrode 32' and the electrode 34 to be described later are arranged so as to face each other with the interlayer insulating layer 33 disposed therebetween.

The one source/drain region of the drive transistor $TR_D$ is connected to the electrode 34 constituting a wiring, a capacitor unit, or the like via a contact hole 36 provided in the interlayer insulating layer 33. Note that the connection part between the contact hole 36 and the electrode 34 is hidden and cannot be seen. On the interlayer insulating layer 33, further, an interlayer insulates layer 40 is formed.

On the interlayer insulating layer 40, the light-emitting unit ELP including the anode electrode 51, a hole transport layer, a light-emitting layer, an electron transport layer, and a cathode electrode 53 is provided. Note that in the figure the hole transport layer, the light-emitting layer, and the electron transport layer are expressed as a single layer 52. A second interlayer insulating layer 54 is provided on a portion in which the light-emitting unit ELP is not provided on the interlayer insulating layer 40. A transparent substrate 60 is disposed on the second interlayer insulating layer 54 and the cathode electrode 53. Light emitted in the light-emitting layer passes through the substrate 60 and is emitted to the outside.

The anode electrode 51 and the other source/drain region of the drive transistor $TR_D$ are connected to each other via a contact hole 35 or the like provided to the interlayer insulating layer 33. Further, the cathode electrode 53 is connected to wiring 37 (corresponding to the common feeder line PS2 to which the voltage $V_{Cath}$ is supplied) provided on the extending portion of the interlayer insulating layer 33, via contact holes 56 and 55 that are respectively provided to the second interlayer insulating layer 54 and the interlayer insulating layer 40.

Next, the configuration of the source driver 100 will be described. FIG. 3 is a schematic diagram for describing an arrangement relationship between the display unit, a source driver, a vertical scanner, and a power supply unit on a semiconductor substrate.

In the case where, for example, the display unit 2, the source driver 100, and the like are integrally formed on the semiconductor substrate 20, basically, it is favorable to form a part of the source driver 100 and the like corresponding to the display device 10 at a pitch similar to the arrangement pitch of the display devices 10 or the arrangement pitch of the pixels including a group of the display devices 10. In the case where the arrangement pitch differs, a region in which a connection wiring for adjusting the pitch difference is to be provided is necessary, which enlarges a so-called frame region. Therefore, this results in an increase in chip size, which causes a factor of a cost increase.

In the example shown in FIG. 3, parts of the source driver 100 corresponding to the pixels are formed at a pitch similar to the arrangement pitch of the group of the red-color display device $10_R$, the green-color display device $10_G$, and the blue-color display device $10_B$. Meanwhile, parts of the vertical scanner 110 and parts of the power supply unit 120 corresponding to the display devices 10 are formed at a pitch similar to the arrangement pitch of the display devices 10. The part of the vertical scanner 110 and the part of the power supply unit 120 corresponding to the display device 10 in the m-th row are respective represented by reference symbols $110_m$ and $120_m$. Further, the part of the source driver 100 corresponding to the pixel group in the n'-th column (n'=1, 2 . . . , N') is represented by a reference symbol $100_{n'}$.

The vertical scanner 110, the power supply unit 120, and the like can each be formed by using a small-scale logical circuit such as a shift register. Therefore, it is easy to deal with narrowing the pitch of the circuit demanded as the pitch of the display device 10 is reduced. Meanwhile, the source driver 100 has a relatively large-scale circuit configuration. Therefore, it is desired to reduce the circuit scale for the source driver 100.

Figure 4:
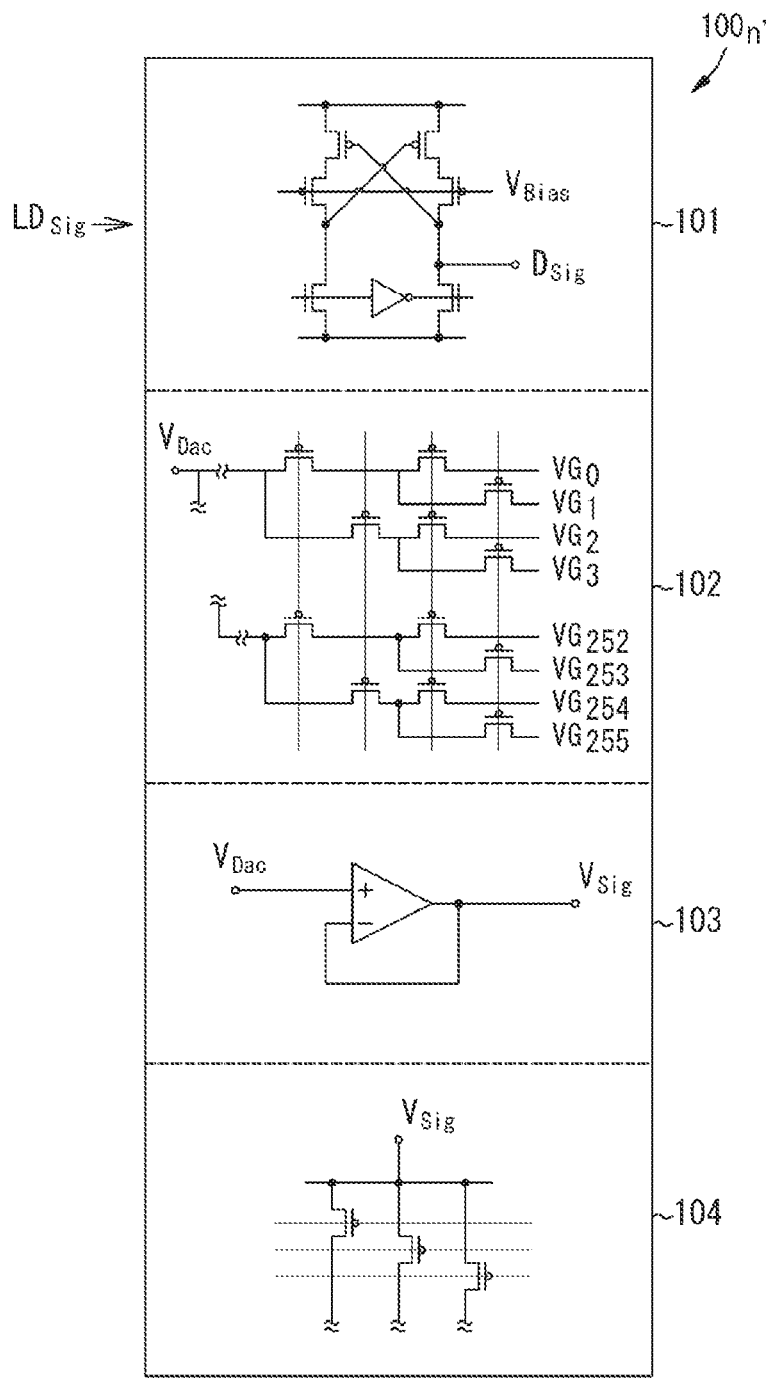
FIG. 4 is a schematic diagram for describing a configuration of the source driver.

FIG. 4 is a schematic diagram for describing a configuration of a source driver. More specifically, FIG. 4 shows a configuration of a part of the source driver 100 corresponding to the pixel group in the n'-th column.

The source driver 100 includes a level shifter 101 for increasing the voltage of the video signal $LD_{Sig}$, a digital/analog converter circuit 102 that outputs a voltage $V_{Dac}$ depending on a gradation value of a video signal $D_{Sig}$ obtained by increasing the voltage of the video signal $LD_{Sig}$, an amplifier circuit 103 that enhances the driving capability of the voltage $V_{Dac}$ and outputs it as a driving voltage $V_{Sig}$, a distribution circuit 104 that distributes the driving voltage $V_{Sig}$ to the data line in a time-division manner depending on each display device 10 constituting the pixel.

The level shifter 101 can be configured by using, for example, a current mirror circuit or the like. The amplifier circuit 103 can be configured by using a voltage buffer including a source follower circuit, for example. The distribution circuit 104 can be configured by using a transistor or the like. That is, these circuits can be configured by using well-known circuit devices.

The digital/analog converter circuit 102 includes many devices in order to select a voltage and output the selected voltage. Therefore, the digital/analog converter circuit 102 has a large circuit scale as compared with another part such as the level shifter 101. Now, in order to aid the reader's understanding of the present disclosure, a source driver of a reference example, which includes a tournament type digital/analog converter circuit 102' having a general configuration, will be described.

Figure 5:
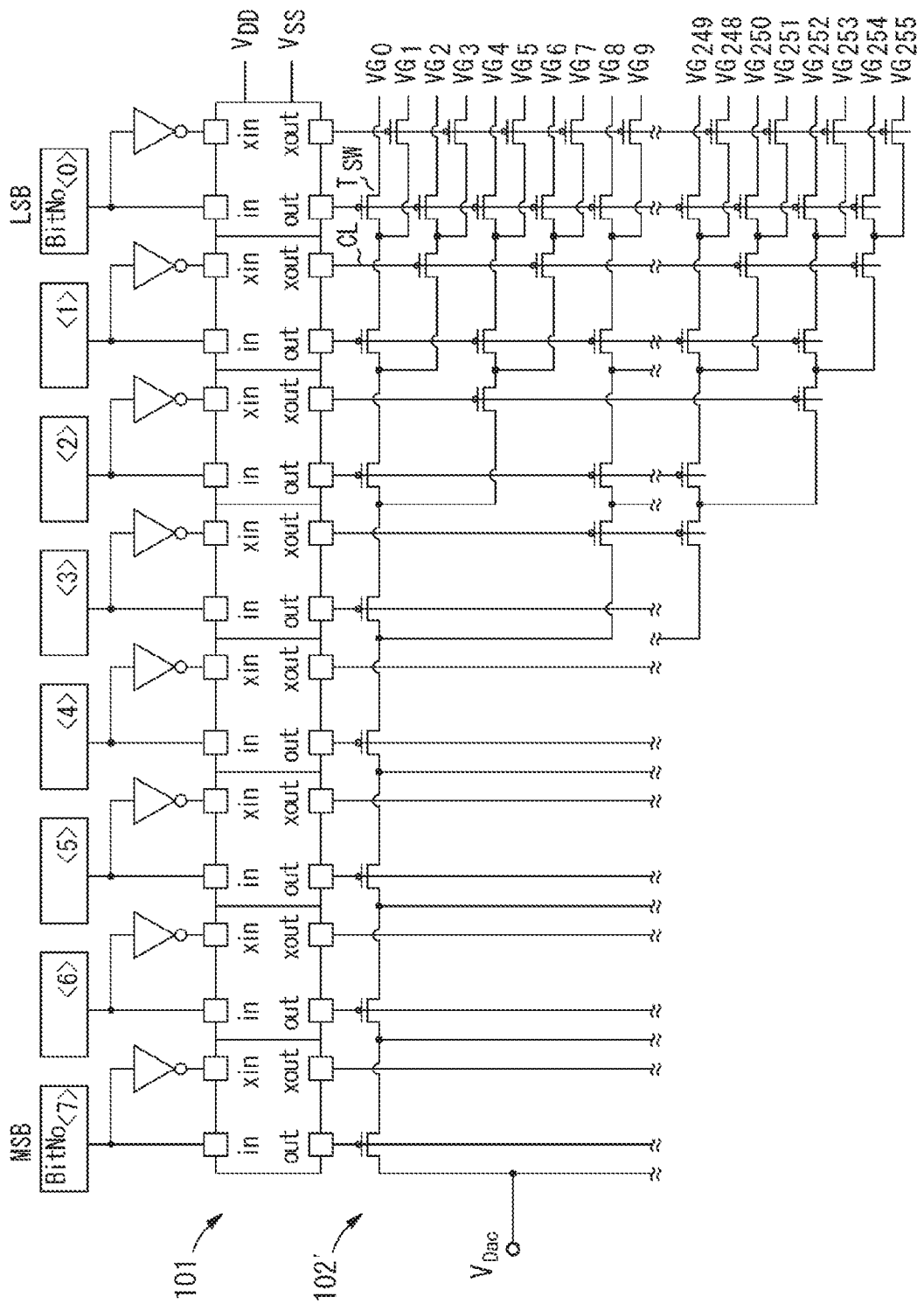
FIG. 5 is a schematic circuit diagram for describing a configuration of a source driver of a reference example, which includes a tournament type digital/analog converter circuit.
Figure 6:
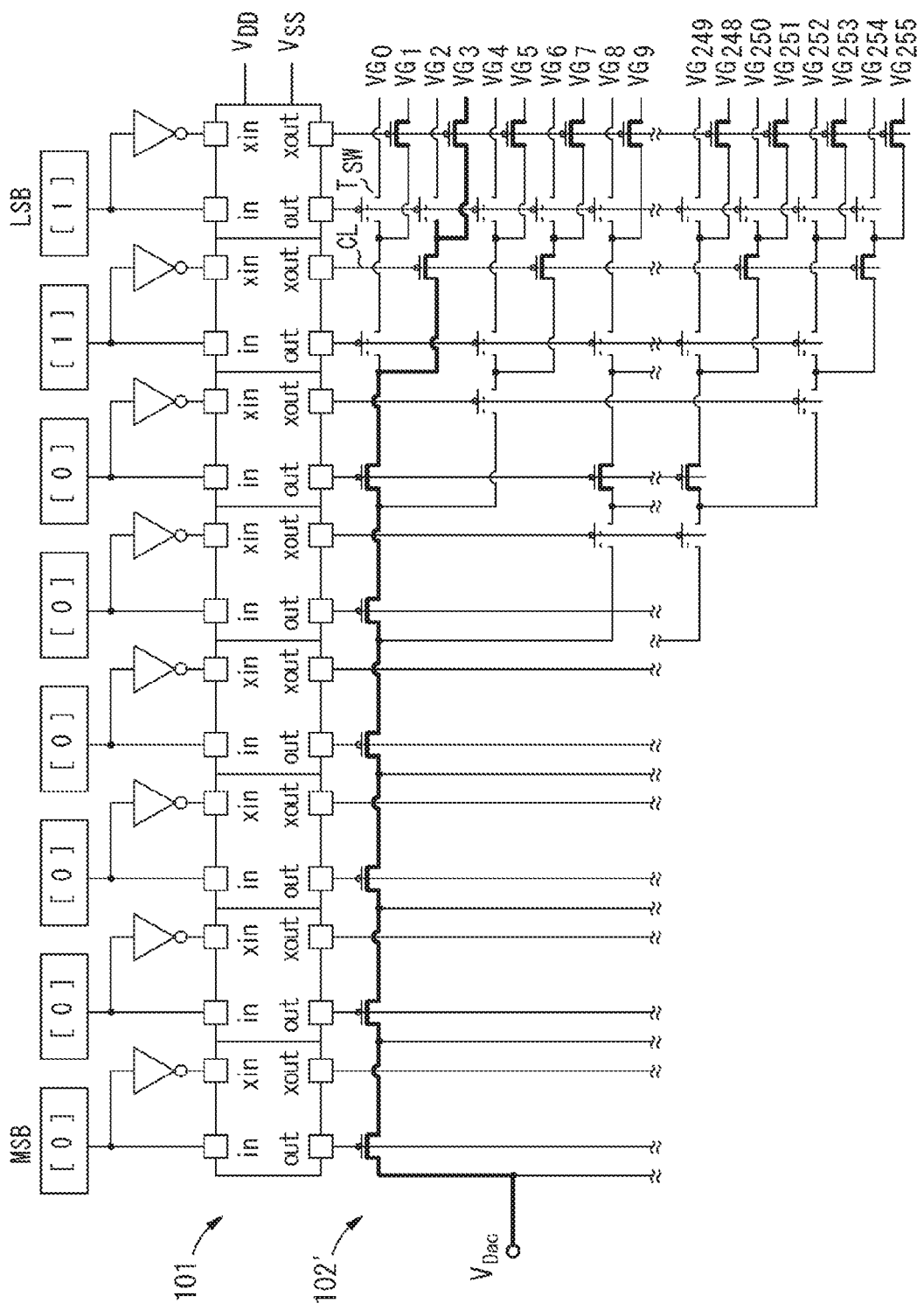
FIG. 6 a schematic circuit diagram for describing an operation of the source driver of the reference example.

FIG. 5 is a schematic circuit diagram for describing a configuration of a source driver of a reference example, which includes a tournament type digital/analog converter circuit. FIG. 6 is a schematic circuit diagram for describing an operation of the source driver of the reference example.

For convenience of illustration, in these figures, description of the amplifier circuit 103 and the distribution circuit 104 is omitted. A reference symbol $V_{DD}$ and a reference symbol $V_{SS}$ are respectively a power supply voltage (e.g., ten and several volts) supplied for driving the source driver and a ground voltage (e.g., 0 volt). This applies to other figures to be described later.

Bit signals of the digital signal $LD_{Sig}$ corresponding to the input gradation are input to the level shifter 101 as pairs of the bit signals and reversed signals thereof. The signals are input to a part represented by a reference symbol [in] as they are, and the reversed signals are input to a part represented by a reference symbol [xin]. The level shifter 101 outputs the signal obtained by increasing the voltage of the input signal. The output corresponding to the input [in] and the output corresponding to the input [xin] are respectively represented by a reference symbol [out] and a reference symbol [xout].

In the case of a 8 bit gradation, the tournament digital/analog converter circuit 102' selects one voltage corresponding to the gradation value from 256 types of voltages of the voltages $VG_0$ to $VG_{255}$. The voltages $VG_0$ to $VG_{255}$ can be generated by, for example, a plurality of reference voltages and voltages obtained by dividing a reference voltage with a resistor circuit including a ladder resistor (gamma resistor) or the like. FIG. 6 shows an operational example when the digital signal $LD_{Sig}$ is a bit signal of [00000011]. By driving a control line CL on the basis of the output of the level shifter 101, a conductive state/non-conductive state of a transistor $T_{SW}$ (including a p-channel field-effect transistor) is controlled. Accordingly, a predetermined voltage (in this case, voltage $VG_3$) is selected and output as the voltage $V_{Dac}$. Note that the transistor $T_{SW}$ in a conductive state is shown by a thick solid line, and the transistor $T_{SW}$ in a non-conductive state is shown by broken lines of fine lines. This applies to other figures to be described later.

In the tournament digital/analog converter circuit 102' shown in FIG. 6, the total number of transistors $T_{SW}$ is 510. In the case of dealing with 10 bit gradation, the total number of transistors $T_{SW}$ is substantially four times, which enlarges the circuit scale.

In this regard, the source driver 100 according to the first embodiment uses a decoding-type digital/analog converter circuit. This is a configuration in which the digital signal corresponding to the input gradation is merged in a logical circuit to increase the number of analog signals that can be selected at once. Therefore, it is a configuration is which a logical circuit for decoding processing is disposed next to the level shifter.

Figure 7:
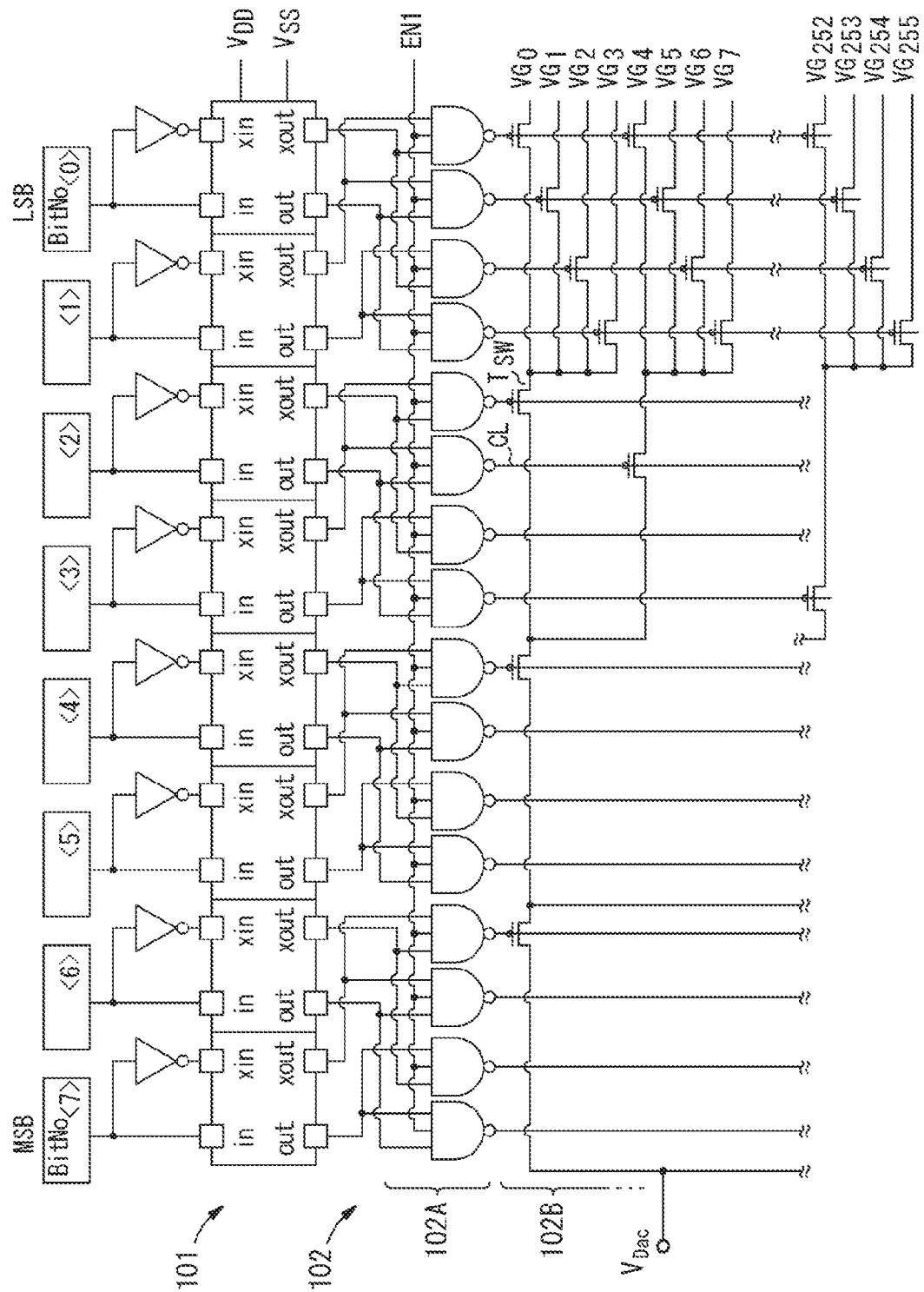
FIG. 7 is a schematic circuit diagram for describing a configuration of a source driver according to the first embodiment.

FIG. 7 is a schematic circuit diagram for describing a configuration of the source driver according to the first embodiment. Note that similarly to FIG. 4, a configuration of a part of the source driver 100 corresponding to the pixel group in the n'-th column is shown. For convenience of illustration, description of the amplifier circuit 103 and the distribution circuit 104 is omitted.

The digital/analog converter circuit 102 shown in FIG. 7 includes
a decoding unit 102A that performs decoding processing on a bit signal in a predetermined part of a digital signal, and
a selector circuit 102B that selects and outputs a voltage depending on an output of the decoding unit 102A. Further, a switching device is disposed on at least one of inside of the decoding unit 102A and an output unit side of the decoding unit. 102A, the switching device being controlled by a control signal EN1 different from the bit signal as a target for the decoding processing. In the first embodiment, the switching device controlled by the control signal EN1 is disposed inside the decoding unit 102A.

The decoding unit 102A includes a NAND gate. More specifically, the decoding unit 102A includes a plurality of units each including a pair of NAND gates capable of performing two bit processing, the plurality of units being arrayed in the decoding unit. In the example shown in the figure, four units each including a pair of NAND gates are disposed. A first switching device is connected in series to a path between a power supply voltage side in an output circuit of the NAND gate and a ground voltage side. In addition, a method of driving the digital/analog converter circuit according to the first aspect includes performing, when an output of the NAND gate transits, control of blocking the path between the power supply voltage side in the output circuit of the NAND gate and the ground voltage side.

Detailed content of the above will be described later with reference to FIG. 15 to FIG. 18 to be described in detail later.

Even with a configuration including the decoding unit 102A, in the case of 8 bit gradation, there is still a need to select one voltage corresponding to the gradation value from 256 types of voltages of the voltages $VG_0$ to $VG_{255}$. However, since four pieces of data can be selected by a unit including a pair of NAND gates capable of performing two bit processing, the necessary total number of transistors $T_{SW}$ constituting the selector circuit 102B that selects a voltage from the voltage $VG_0$ to the voltage $VG_{255}$ is only 340. Therefore, it is possible to reduce the circuit scale as compared with the tournament type digital/analog converter circuit, and achieve pitch narrowing and miniaturization.

In the first embodiment, by controlling the switching device disposed inside the decoding unit 102A on the basis of the control signal EN1, noise caused by the operation of the decoding unit 102A is reduced. Now, in order to aid the reader's understanding of the present disclosure, an operation, a problem, and the like of the source driver of the reference example having a configuration in which the switching device controlled by the control signal EN1 is removed will be described.

Figure 8:
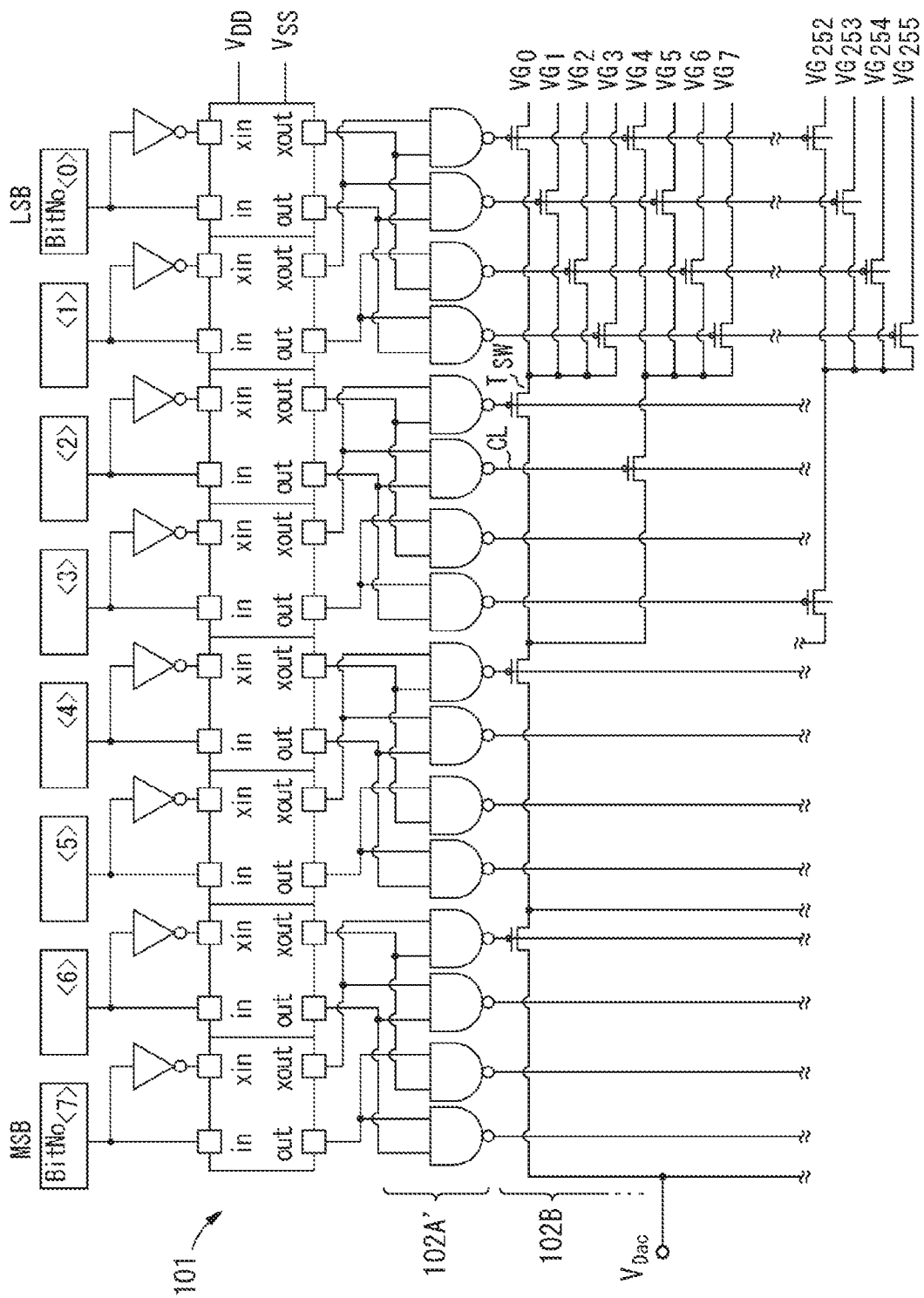
FIG. 8 is a schematic circuit diagram for describing a configuration of the source driver of the reference example.

FIG. 8 is a schematic circuit diagram for describing a configuration of the source driver of the reference example. A decoding unit of the source driver of the reference example is represented by a reference symbol 102A'.

Figure 9:
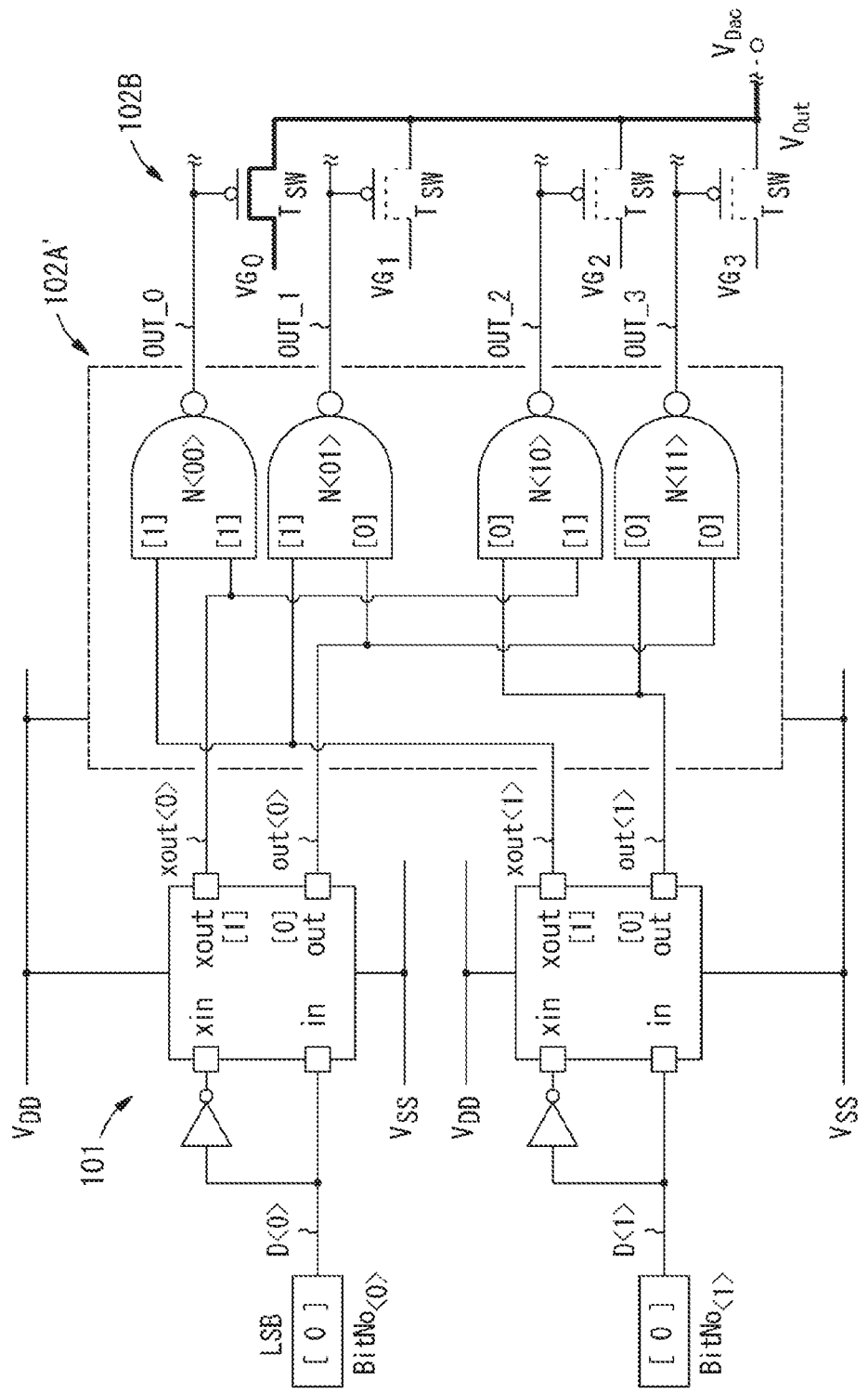
FIG. 9 is a schematic circuit diagram for describing an operation of a part performing the signal processing of the lower two bits of a video signal in the source driver of the reference example, and shows the operation in the case where the lower two bits of the video signal are [00].
Figure 10:
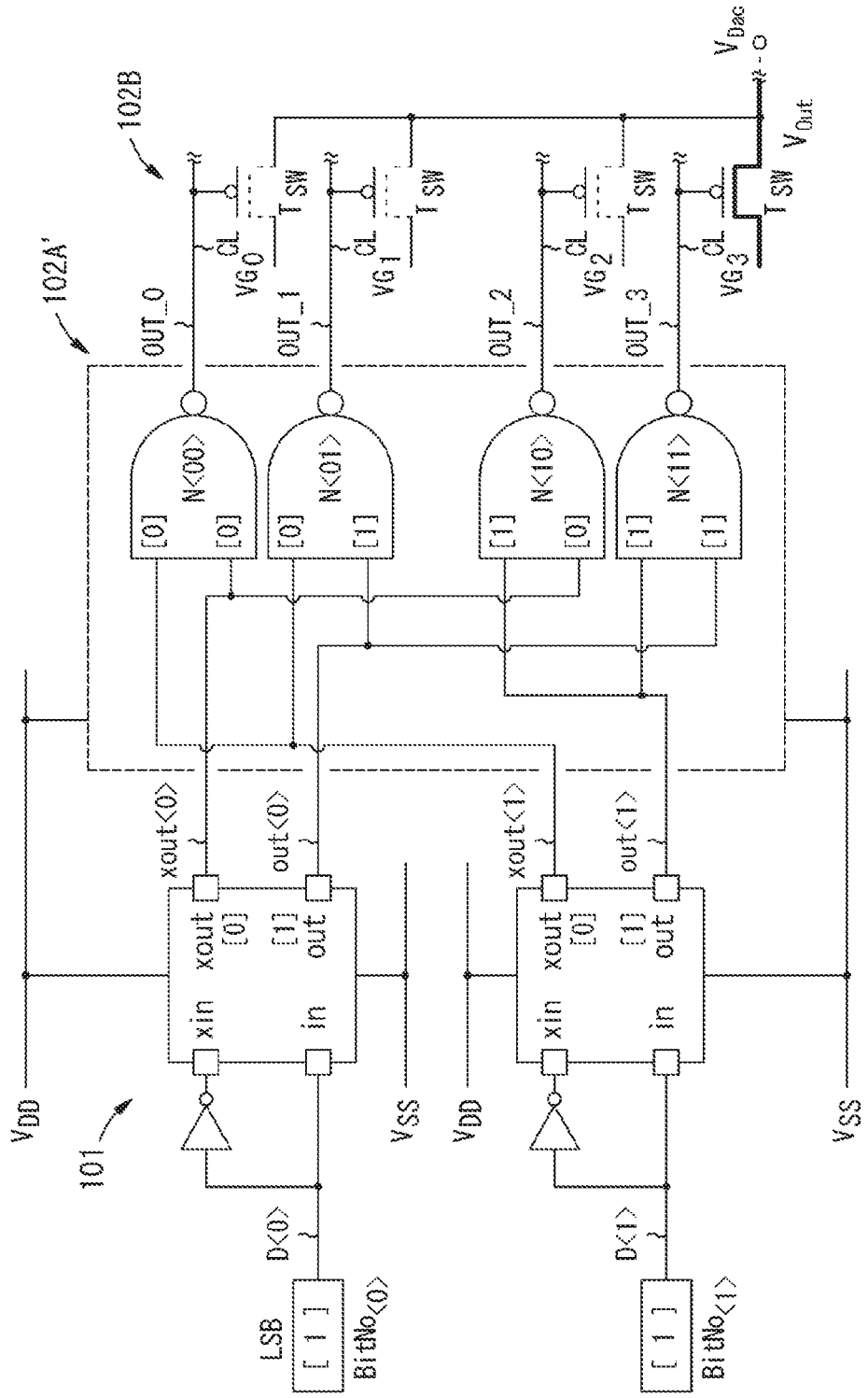
FIG. 10 is a schematic circuit diagram for describing an operation of the part performing the signal processing of the lower two bits of the video signal in the source driver of the reference example, subsequently to FIG. 9, and shows the operation in the case where the lower two bits of the video signal are [11].

FIG. 9 is a schematic circuit diagram for describing an operation of a part performing the signal processing of the lower two bits of a video signal in the source driver of the reference example, and shows the operation in the case where the lower two bits of the video signal are [00]. FIG. 10 is a schematic circuit diagram for describing an operation of the part performing the signal processing of the lower two bits of the video signal in the source driver of the reference example, subsequently to FIG. 9, and shows the operation in the case where the lower two bits of the video signal are [11].

In the following description, a case where the bit value is [0] will be represented by a low level or [L], and a case where the bit value is [1] will be represented by a high level or [H] in some cases. For convenience of description, the part performing signal processing of the lower two bits of the video signal will be described. However, a similar phenomenon occurs for every two bits also in a part performing signal processing of upper six bits.

A AND gate that operates to select the voltage $VG_0$ when the lower two bits are [00], a NAND gate that operates to select the voltage $VG_1$ when the lower two bits are [01], a NAND gate that operates to select the voltage $VG_2$ when the lower two bits are [10], and a NAND gate that operates to select the voltage $VG_3$ when the lower two bits are [11] in the video signal $LD_{Sig}$ are respectively represented by reference symbols N<00>, N<01>, N<10> and N<11>. Further, outputs of the NAND gates N<00>, N<01>, N<10>, and N<11> are represented by reference symbols OUT_0, OUT_1, OUT_2, and OUT_3.

Figure 11:
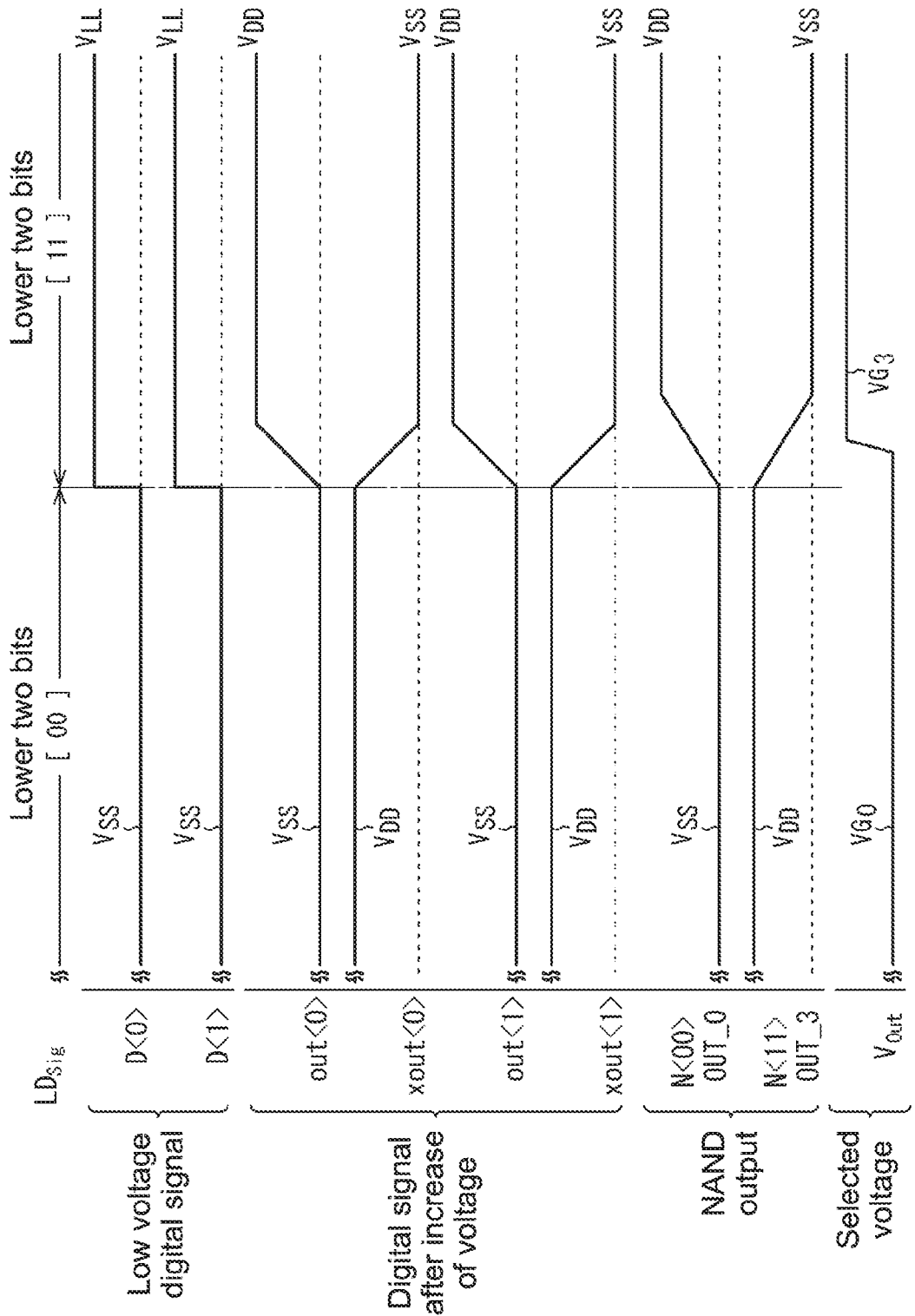
FIG. 11 is a schematic timing chart in the case of shifting from the state shown in FIG. 9 to the state shown in FIG. 10.

A case where the lower two bits in the video signal $LD_{Sig}$ input to the source driver is changed from [00] to [11] will be assumed. FIG. 11 is a schematic timing chart in the case of shifting from the state shown in FIG. 9 to the state shown in FIG. 10. In FIG. 11, a reference symbol $V_{LL}$ represents a voltage when the video signal $LD_{Sig}$ that is a low voltage digital signal is at a high level. The voltage has, for example, a value of approximately 1.8 volt.

When the lower two bits of the video signal $LD_{Sig}$ are [00], the outputs of the NAND gates N<00>, N<01>, N<10>, and N<11> are respectively [L] (voltage $V_{SS}$), [H] (voltage $V_{DD}$), [H] (voltage $V_{DD}$), and [H] (voltage $V_{DD}$).

When the lower two bits of the video signal $LD_{Sig}$ are changed to [11], first, signals D<0> and D<1> input to the level shifter 101 are changed. A signal $D_{Sig}$ obtained by level-converting (increasing the voltage of) the video signal $LD_{Sig}$ through the level shifter 101 has a waveform with transient, and is input to a NAND gate.

FIG. 12A is a schematic circuit diagram for describing an operation when the lower two bits of the video signal shift from [00] to [11] in a NAND gate that operates so as to select a voltage $VG_0$ in the case where the lower two hats of the video signal are [00]. FIG. 12B is a schematic timing chart for describing an input signal of the NAND gate when the lower two bits of the video signal shift from [00] to [11].

As described above, the signal $D_{Sig}$ obtained by level-converting (increasing the voltage of) the video signal $LD_{Sig}$ through the level shifter 101 has a waveform with transient, and is input to a NAND gate. Therefore, when the lower two bits transit from [00] to [11], the xout<1> and xout<0> input to the NAND gate N<00> are changed with a certain slope from the voltage $V_{DD}$ that is a high level to the voltage $V_{SS}$ that is a low level. Meanwhile, the NAND gate becomes logic unstable, and a through current flows. Hereinafter, it will be described in detail with reference to FIG. 13.

FIG. 13A is a schematic circuit diagram for describing a through current flowing to the NAND gate in a transition period when the lower two bits of the video signal shift from [00] to [11]. FIG. 13B is a schematic timing chart and graph for describing the through current flowing to the NAND gate in the transition period.

Here, description will be made assuming that the output circuit of the NAND gate includes p-channel transistors $T_{1a}$ and $T_{1b}$, and n-channel transistors $T_{2a}$ and $T_{1b}$. When each of the xout<1> and xout<0> is the voltage VDD that is a high level, the p-channel transistors $T_{1a}$ and $T_{1b}$ are each in a non-conductive state, and the n-channel transistors $T_{2a}$ and $T_{2b}$ are each in a conductive state. Therefore, the voltage $V_{SS}$ that is a low level is output (see the left diagram in FIG. 13A). Meanwhile, when each of the xout<1> and xout<0> is the voltage $V_{SS}$ that is a low level, the p-channel transistors $T_{1a}$ and $T_{1b}$ are each in a conductive state, and the n-channel transistors $T_{2a}$ and $T_{2b}$ are each in a non-conductive state. Therefore, the voltage $V_{DD}$ that is a high level is output (see the right diagram of FIG. 13A).

However, in the transition period in which the lower two bits of the video signal shift from [00] to [11], each of the xout<1> and xout<0> is a voltage between the voltage $V_{DD}$ and the voltage $V_{SS}$, e.g., in a logic unstable state such as a voltage $V_{Mid}$. At this time, all the transistors $T_{1a}$, $T_{1b}$, $T_{2a}$, and $T_{2b}$ are in a conductive state, a through current $I_1$ flows from a power supply voltage side to a ground voltage side via these transistors (see the central diagram of FIG. 13A). Although depending on the configuration of the NAND gate, the operation conditions, and the like, a through current of approximately several tens to a hundred microamperes flows for each NAND gate.

Further, when the lower two bits of the video signal shift from [00] to [11], also a current accompanying charging/discharging to the control line CL supplied with the output of the NAND gate flows. Hereinafter, description will be made with reference to FIG. 14.

FIG. 14A is a schematic circuit diagram for describing a current flowing from the output of the NAND gate that operates so as to select the voltage $VG_0$ in the case where the lower two bits of the video signal are [00] when the lower two bits of the video signal shift from [00] to [11] in the NAND gate. FIG. 14B is a schematic timing chart and graph for describing the current flowing from the output of the NAND gate in the transition period.

When each of the xout<1> and xout<0> is the voltage $V_{DD}$ that is a high level, the p-channel transistors $T_{1a}$ and $T_{1b}$ are each in a non-conductive state, and the n-channel transistors $T_{2a}$ and $T_{2b}$ are each in a conductive state. Therefore, the voltage $V_{SS}$ that is a low level is output from the NAND gate and supplied to the control line CL. Charges depending on the voltage $V_{SS}$ are held in a capacitor component $C_{Dac}$ of the control line CL (see the left diagram of FIG. 14A).

Here, when each of the xout<1> and xout<0> shifts to the voltage $V_{SS}$ that is a low level, the voltage $V_{DD}$ that is a high level is output from the NAND gate and supplied to the control line CL (see the right diagram of FIG. 14A). As the voltage is changed, a current $I_2$ flows so as to charge/discharge the capacitor component $C_{Dac}$. Although depending on the configuration of the NAND gate, the operation conditions, and the like, a charging/discharging current of approximately several tens microamperes flows for each NAND gate. As a result, a current obtained by adding the charging/discharging current $I_2$ to the above-mentioned through current $I_1$ flows through the NAND gate during the time from when it is in a logic unstable state to when it becomes logic stable at the next time.

The part performing signal processing of the lower two bits of the video signal has been described heretofore. However, a similar phenomenon occurs for every two bits also in a part performing signal processing of upper six bits. As a result, regarding a part 100n' of the source driver 100 corresponding to the pixel group in the n'-th column, the current flowing to the NAND gate in the transition period has a value of several hundreds of microamperes. Therefore, in the entire source driver 100, a value of several hundreds to a thousand milliamperes is obtained.

It is inevitable that also a feeder line supplying the power supply voltage $V_{DD}$ or the ground voltage $V_{SS}$ has some resistance value. When a current of several hundreds to a thousand milliamperes flows, a voltage drop occurs due to the resistance of the feeder line, which results in a change in the power supply voltage $V_{DD}$ or the ground voltage $V_{SS}$. This is a factor that affects, for example, the operation of the amplifier circuit 103 located at the subsequent stage of the digital/analog converter circuit, and the like, and generates flicker and periodic noise on the display screen.

The operation, the problem, and the like of the source driver of the reference example having a configuration in which the switching device controlled by the control signal EN1 is removed has been described heretofore.

In the source driver according to the first embodiment, by preventing a through current from flowing to the NAND gate, the current flowing to the NAND gate in the transition period is reduced. Hereinafter, it will be described in detail with reference to the drawings.

Figure 15:
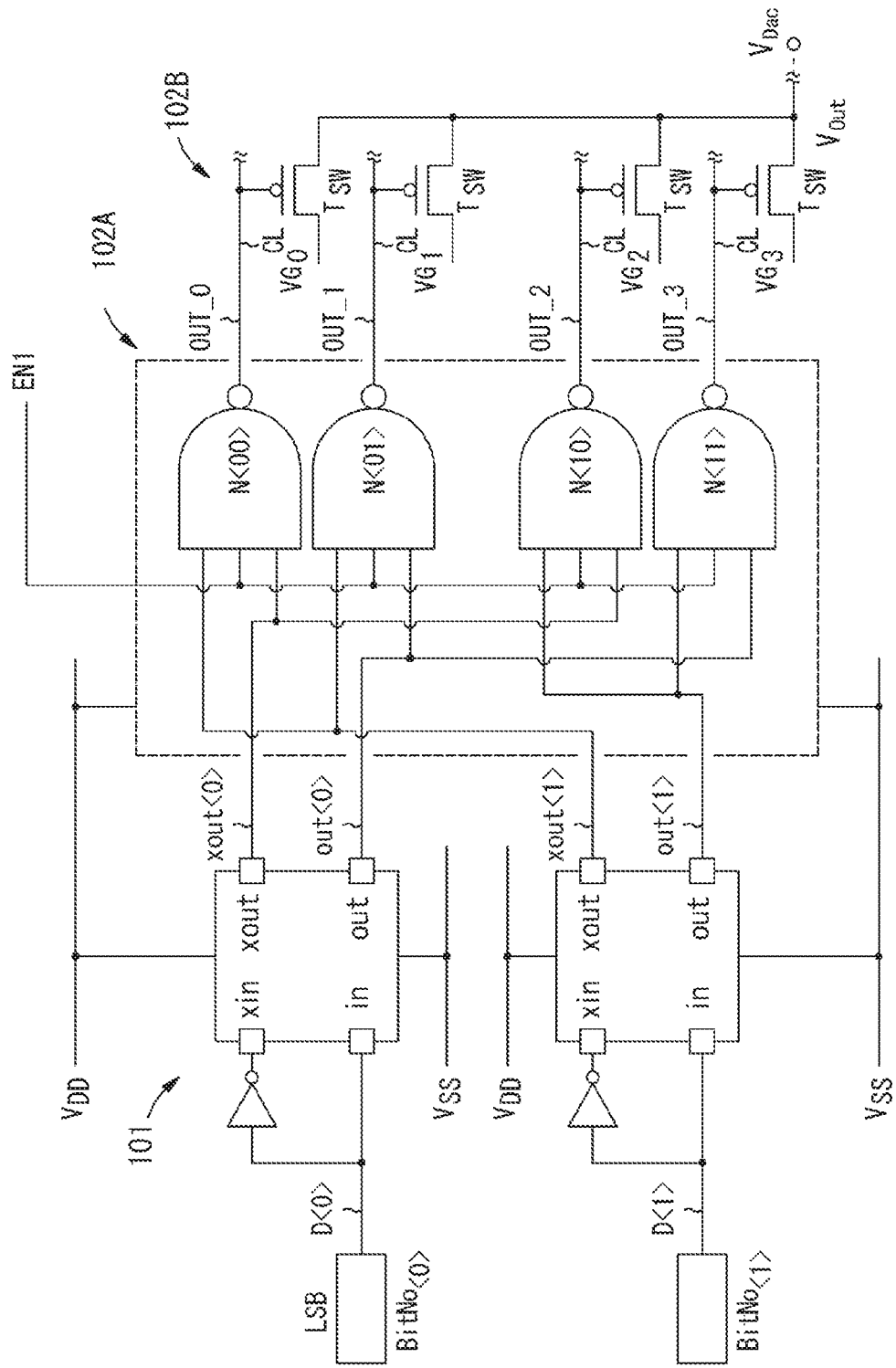
FIG. 15 is a schematic circuit diagram for describing an operation of a part performing signal processing of the lower two bits in the source driver according to the first embodiment.

FIG. 15 is a schematic circuit diagram for describing an operation of a part performing signal processing of the lower two bits in the source driver according to the first embodiment.

As shown in the figure, the control signal EN1 different from the bit signal as a target for the decoding processing is commonly input to each NAND gate. By the control signal EN1, the conduction/non-conduction of the first switching device disposed inside the NAND gate is controlled.

FIG. 16A is a schematic diagram of the NAND gate used in the source driver according to the first embodiment. FIG. 16B is a schematic circuit diagram of the NAND gate shown in FIG. 16A.

As shown in FIG. 16B, a pair of switching devices $S_{1a}$ and $S_{1b}$ is disposed as the first switching device in the NAND gate. The circuit configuration of the NAND gate used in the source driver according to the first embodiment is obtained by adding the switching devices $S_{1a}$ and $S_{1b}$ to the above-mentioned circuit shown in FIG. 13A.

The switching device $S_{1a}$ includes a p-channel transistor, and the switching device $S_{1b}$ includes an n-channel transistor. The one switching device $S_{1a}$ is connected in series to a part between the output end of the output circuit of the NAND gate and the power supply voltage $V_{DD}$ side. The other switching device $S_{1b}$ is connected in series to a part between the output end of the output circuit of the NAND gate and the ground voltage side. The pair of switching devices $S_{1a}$ and $S_{1b}$ is controlled by the same control signal EN1. Note that in order to deal with the difference in the conductive type, the control signal EN1 is input to the switching device $S_{1b}$ via an inverter.

When the output of the NAND gate transits, the first switching devices $S_{1a}$ and $S_{1b}$ are controlled by the control signal EN1 to block the path between the power supply voltage side in the output circuit and the ground voltage side. Hereinafter, it will be described in detail with reference to FIG. 17 and FIG. 18.

FIG. 17A is a schematic circuit diagram for describing an operation when the lower two bits of the video signal shifts from [00] to [11] in the NAND gate that operates so as to select a voltage $VG_0$ in the case where the lower two bits of the video signal are [00]. FIG. 17B is a schematic timing chart for describing an input signal of the NAND gate when the lower two bits of the video signal shift from [00] to [11].

For convenience of description, the part performing signal processing of the lower two bits of the video signal will be described. However, a similar operation is performed for every two bits also in a part performing signal processing of upper six bits.

The control signal EN1 is basically supplied as a rectangular pulse synchronized with rewriting of the video signal. For example, it can be generated in synchronization with the beginning of the horizontal scanning period of the display apparatus, for example. The length of the period during which the control signal EN1 is at a low level shown in FIG. 17B may be set to, for example, a predetermined length including the above-mentioned transition period by the measurement using an actual machine or the like.

Figure 18:
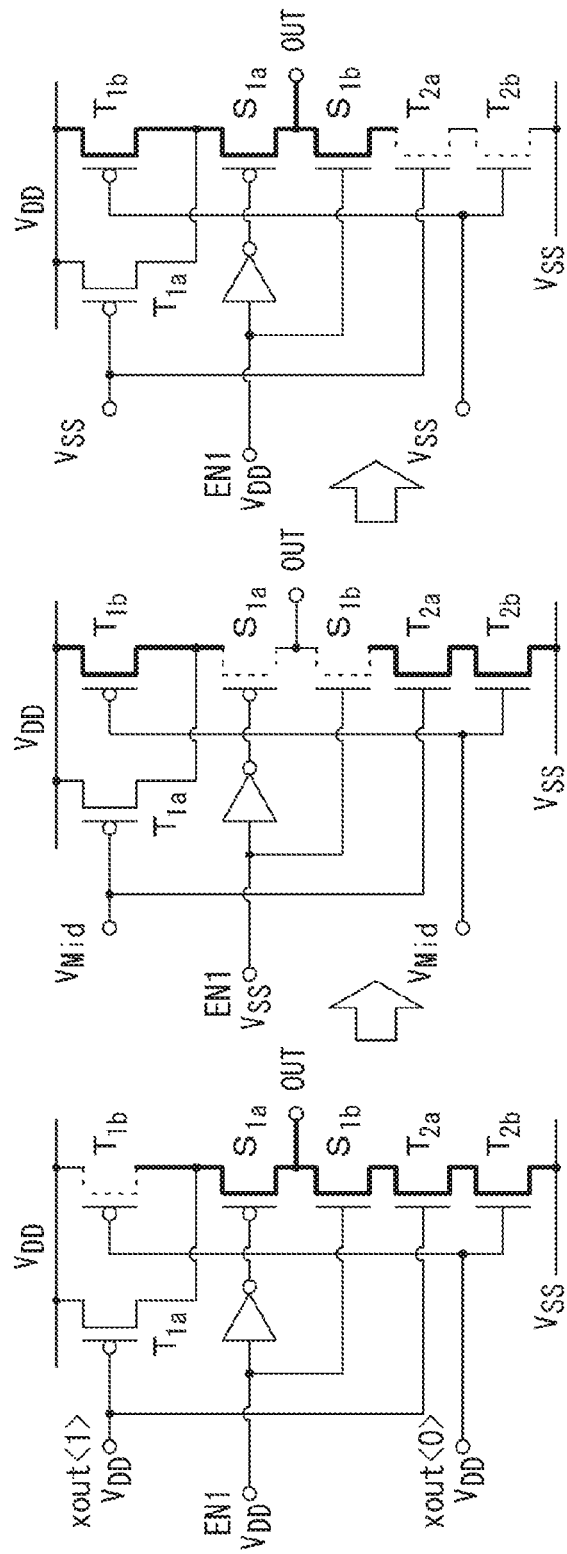
FIG. 18 is a schematic circuit diagram for describing an operation when the lower two bits of the video signal are [00], when the lower two bits of the video signal shift from [00] to [11], and when the lower two bits of the video signal are [11] in the NAND gate that operates so as to select a voltage $VG_0$ in the case where the lower two bits of the video signal are [00].

FIG. 18 is a schematic circuit diagram for describing an operation when the lower two bits of the video signal are [00], when the lower two bits of the video signal shift from [00] to [11], and when the lower two bits of the video signal are [11] in the NAND gate that operates so as to select a voltage $VG_0$ in the case where the lower two bits of the video signal are [00].

When each of the xout<1> and xout<0> is the voltage $V_{DD}$ that is a high level, each of the p-channel transistors $T_{1a}$ and $T_{1b}$ is in a non-conductive state, each of the n-channel transistors $T_{2a}$ and $T_{2b}$ is in a conductive state, and each of the first switching devices $S_{1a}$ and $S_{1b}$ is in a conductive state. Therefore, the voltage $V_{SS}$ that is a low level is output (see the left diagram of FIG. 18).

In the transition period when the lower two bits of the video signal shift from [00] to [11], each of the xout<1> and xout<0> is a voltage between the voltage $V_{DD}$ and the voltage $V_{SS}$, e.g., in a logic unstable state such as the voltage $V_{Mid}$. At this time, all the transistors $T_{1a}$, $T_{1b}$, $T_{2a}$, and $T_{2b}$ are in a conductive state. However, each of the first switching devices $S_{1a}$ and $S_{1b}$ is in a non-conductive state (see the central diagram of FIG. 18). Therefore, no through current flows between the power supply voltage side and the ground voltage side.

When each of the xout<1> and xout<0> is the voltage $V_{SS}$ that is a low level, each of the p-channel transistors $T_{1a}$ and $T_{1b}$ is in a conductive state, each of the n-channel transistors $T_{2a}$ and $T_{2b}$ is in a non-conductive state, and each of the first switching device $S_{1a}$ and $S_{1b}$ is in a conductive state. Therefore, the voltage $V_{DD}$ that is a high level is output (see the right diagram of FIG. 18).

As described above, no through current flows to the NAND gate. Accordingly, since the current flowing to the NAND gate in the transition period is reduced, changes in the power supply voltage $V_{DD}$ and the ground voltage $V_{SS}$ are also reduced.

Note that in the case where bit information is unchanged although the video signal is rewritten, a phenomenon of being logic unstable due to the transition period does not occur. Therefore, the above-mentioned control may be performed only when there is a difference from the bit information before rewriting.

Second Embodiment

Also the second Embodiment relates to the digital/analog converter circuit, the source driver, and the display apparatus according to the first aspect of the present disclosure. Further, the second embodiment relates to the method of driving the digital/analog converter circuit according to the second aspect of the present disclosure.

In a schematic view of a display apparatus 1A according to the second embodiment, it is only necessary to consider the display apparatus 1 as a display apparatus 1A and consider the source driver 100 as a source driver 100A in FIG. 1.

Figure 19:
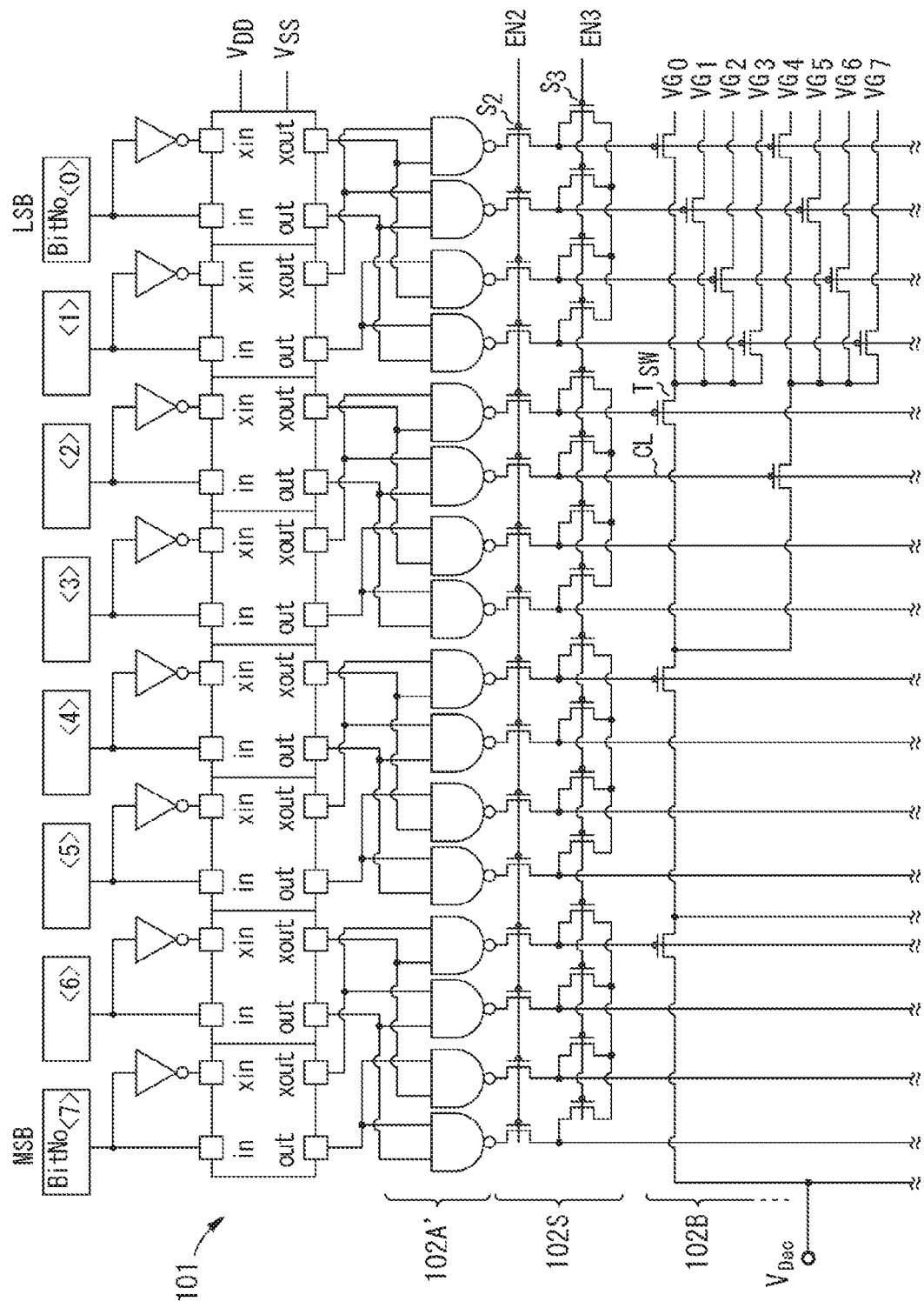
FIG. 19 is a schematic circuit diagram for describing a configuration of a source driver according to a second embodiment.
Figure 20:
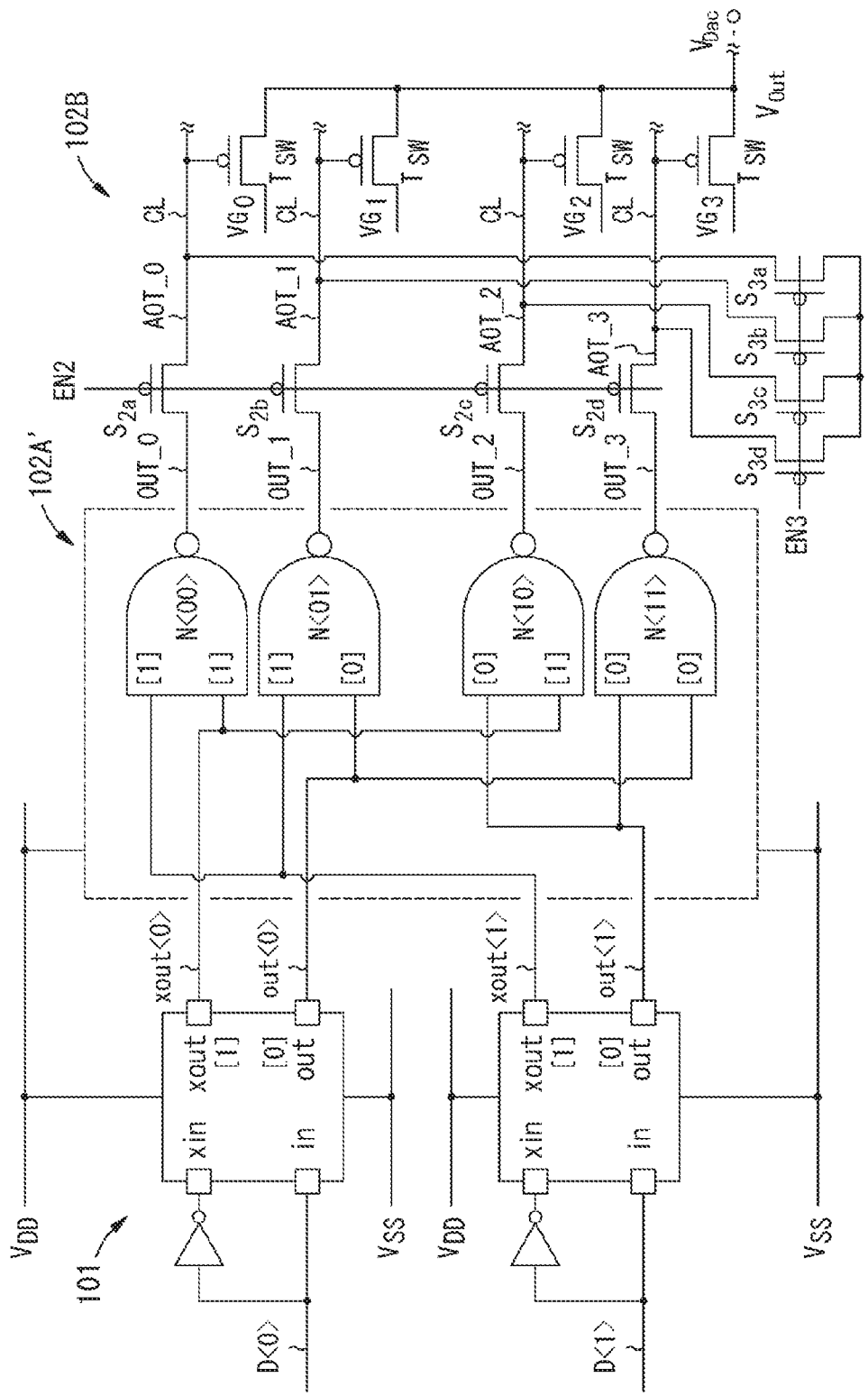
FIG. 20 is a schematic circuit diagram for describing an operation of a part performing signal processing of the lower two bits of the video signal in the source driver according to the second embodiment.

FIG. 19 is a schematic circuit diagram for describing a configuration of the source driver according to the second embodiment. Note that similarly to FIG. 4, a configuration of a part of the source driver corresponding to the pixel group in the n'-th column is shown. For convenience of illustration, description of the amplifier circuit 103 and the distribution circuit 104 is omitted. FIG. 20 is a schematic circuit diagram for describing an operation of a part performing signal processing of the lower two bits of the video signal in the source driver according to the second embodiment.

A digital/analog converter circuit 1102 shown in FIG. 19 includes
a decoding unit 102A' that performs decoding processing on a bit signal in a predetermined part of digital signal, and
the selector circuit 102B that selects and outputs a voltage depending on an output of the decoding unit 102A'.

The configuration of the decoding unit 102A' is the configuration described in the first embodiment with reference to FIG. 9. Further, switching devices $S_2$ and $S_3$ are disposed on an output unit side of the decoding unit 102A', the switching devices being respectively controlled by control signals EN2 and EN3 different from the bit signal as a target for the decoding processing. A reference symbol 102S represents an arrangement part of the switching devices.

More specifically, on the output unit side of the decoding unit 102A', second switching devices $S_2$ ($S_{2a}$, $S_{2b}$, $S_{2c}$, and $S_{2d}$) and third switching devices $S_3$ ($S_{3a}$, $S_{3b}$, $S_{3c}$, and $S_{3d}$) are disposed corresponding to the respective control lines CL of the selector circuit 102B corresponding to the decoding unit 102A'. These transistors each include a n-channel transistor.

The output unit of the decoding unit is connected to the control line CL of the selector circuit corresponding to the decoding unit via the corresponding second switching device $S_2$. The control lines CL of the selector circuit are connected to each other via the third switching devices $S_3$. Further, the method of driving the digital/analog converter circuit according to the second aspect includes performing, when the output of the decoding unit transits, control of short-circuiting the corresponding control line CL of the selector circuit while the output unit of the decoding unit and the control line CL of the selector circuit are disconnected.

Figure 21:
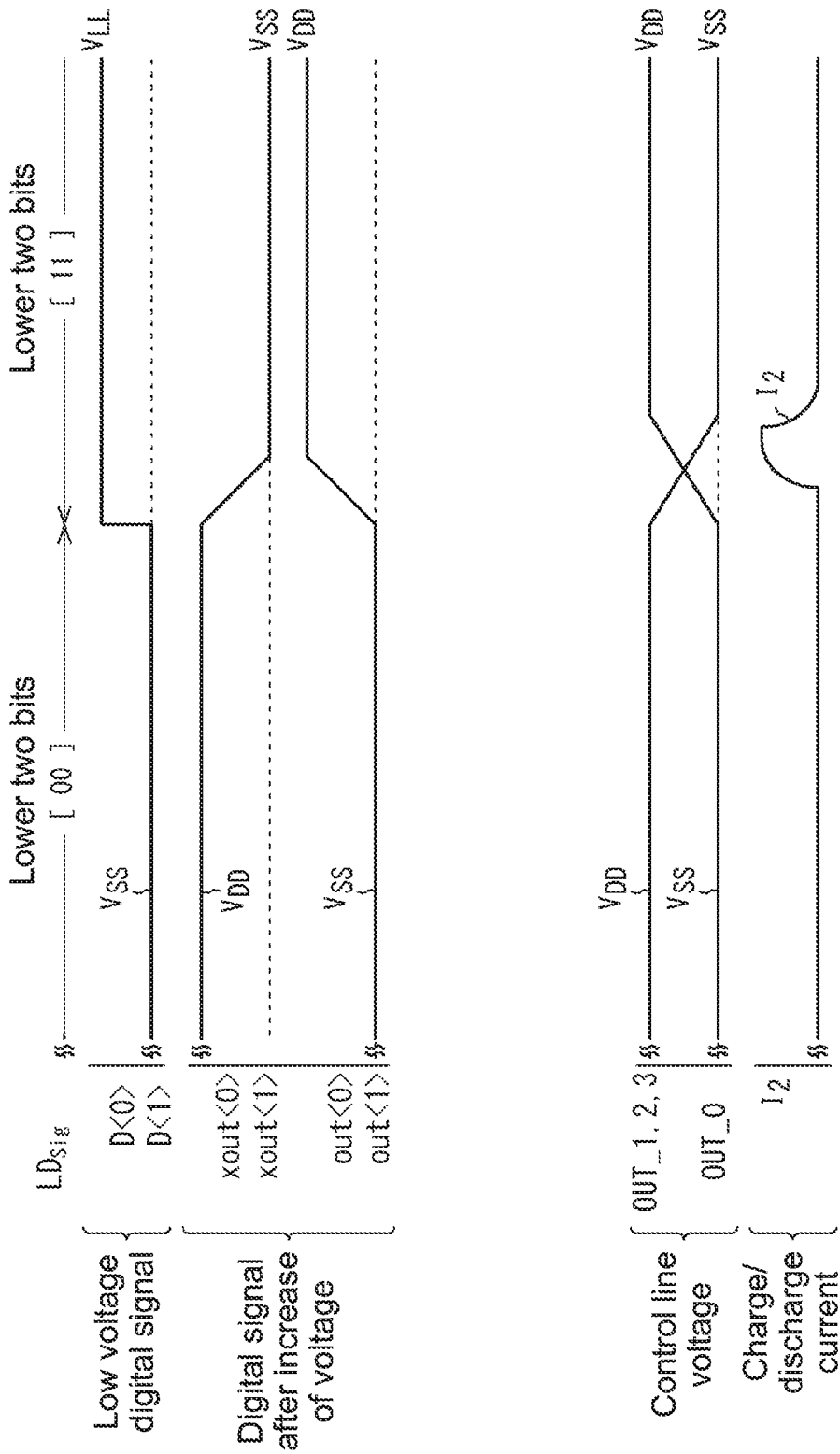
FIG. 21 is a schematic timing chart and graph for describing an operation when the lower two bits of the video signal shift from [00] to [11] in a part performing signal processing of the lower two bits of the video signal in the source driver of the reference example shown in FIG. 9.

In the first embodiment, the charging/discharging current $I_2$ in the source driver of the reference example using the decoding unit 102A' has been described with reference to FIGS. 9 to 13 and FIG. 14. FIG. 21 is a schematic timing chart and graph for describing an operation and the charging/discharging current $I_2$ when the lower two bits of the video signal shift from [00] to [11] in a part performing signal processing of the lower two bits of the video signal in the source driver of the reference example shown in FIG. 9.

On the output unit side of the decoding unit 102A', the second switching devices $S_2$ ($S_{2a}$, $S_{2b}$, $S_{2c}$, and $S_{2d}$) and the third switching devices $S_3$ ($S_{3a}$, $S_{3b}$, $S_{3c}$, and $S_{3d}$) are disposed corresponding to the respective control lines CL of the selector circuit 102B corresponding to the decoding unit 102A'. These transistors each include a p-channel transistor.

It is an object of the second embodiment to reduce the charging/discharging current $I_2$ shown in FIG. 21. As will be described later, when the output of the decoding unit transits, control of short-circuiting the corresponding control line CL of the selector circuit is performed while the output unit of the decoding unit and the control line CL of the selector circuit are disconnected.

Figure 22:
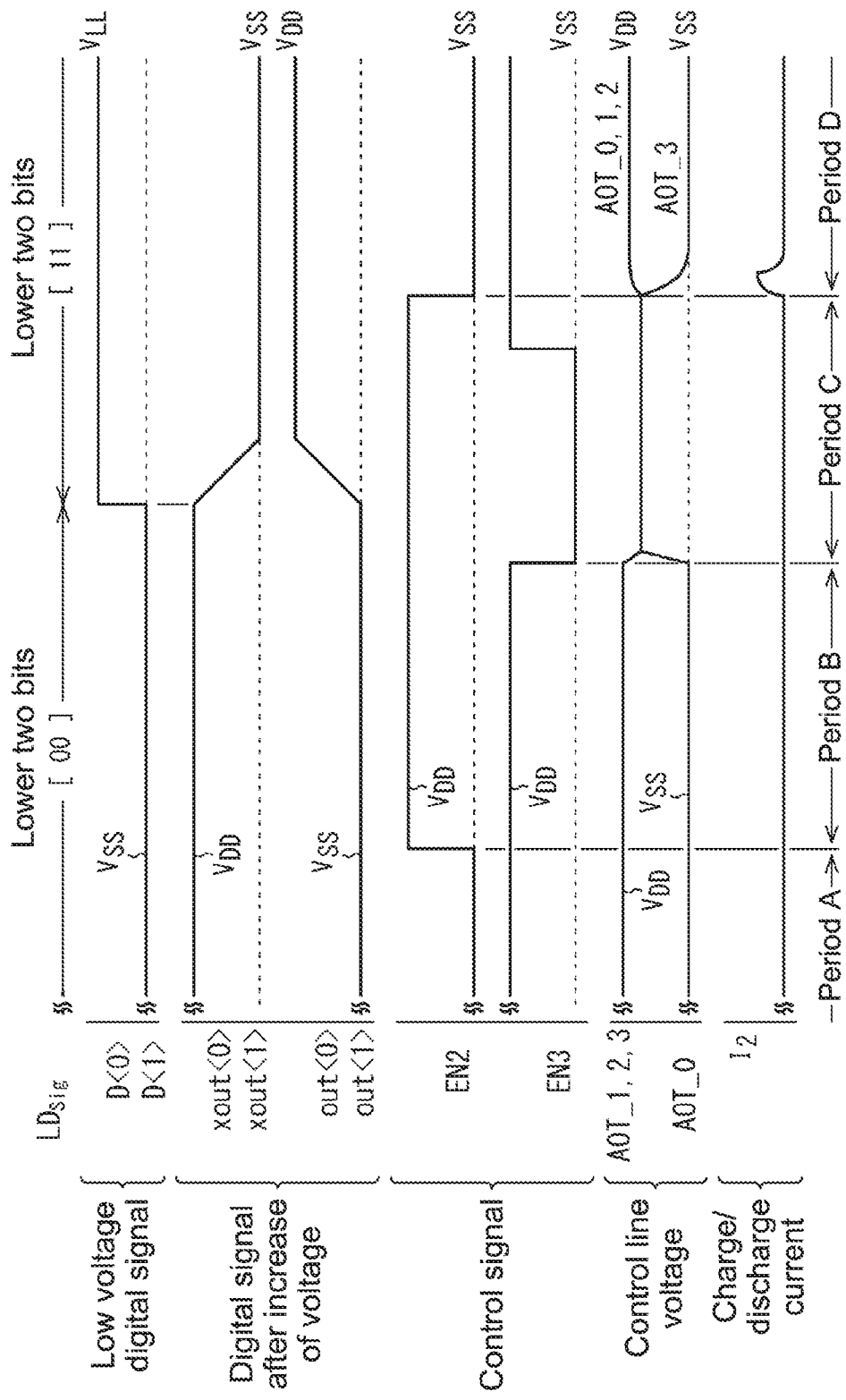
FIG. 22 is a schematic timing chart and graph for describing an operation when the lower two bits of the video signal shift from [00] to [11] in an operation of the part performing signal processing of the lower two bits of the video signal in the source driver according to the second embodiment.

FIG. 22 is a schematic timing chart and graph for describing an operation when the lower two bits of the video signal shift from [00] to [11] in an operation of the part performing signal processing of the lower two bits of the video signal in the source driver according to the second embodiment. FIGS. 23 to 28 are each a schematic circuit diagram for describing an operation when the lower two bits of the video signal shift from [00] to [11] in an operation of the part performing signal processing of the lower two bits of the video signal in the source driver according to the second embodiment. Note that reference symbols AOT_0, AOT_1, AOT_2, and AOT_3 in these figures represent the potential or voltage of the corresponding control line CL. When each of the third switching device $S_3$ is in a conductive state, they correspond to the output voltages OUT_0, OUT_1, OUT_2, and OUT_3 of the NAND gate.

Figure 23:
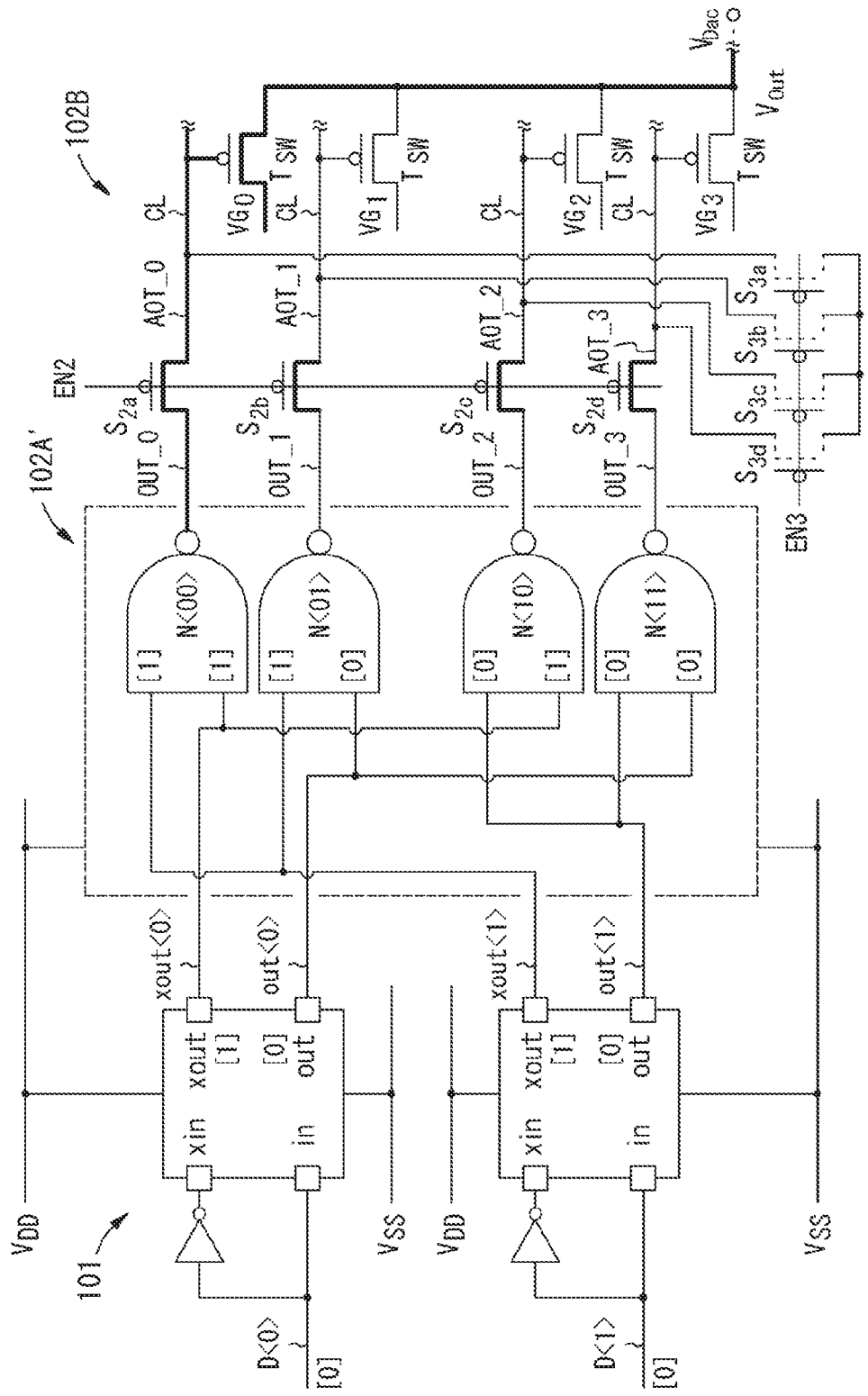
FIG. 23 is a schematic circuit diagram for describing an operation when the lower two bits of the video signal shift from [00] to [11] in an operation of the part performing signal processing of the lower two bits of the video signal in the source driver according to the second embodiment.

[Period A] (See FIG. 22 and FIG. 23)

In this period, the lower two bits of the video signal are [00], the control signal EN2 is at a low level, and the control signal EN3 is at a high level. Each of the second switching devices $S_2$ ($S_{2a}$, $S_{2b}$, $S_{2c}$, and $S_{2d}$) is in a conductive state, and each of the third switching devices $S_3$ ($S_{3a}$, $S_{3b}$, $S_{3c}$, and $S_{3d}$) is in a non-conductive state. The output OUT_0 of the NAND gate N<00> is at a low level, and the outputs of other NAND gates are each at a high level. Therefore, only the transistor that selects the voltage $VG_0$ by the control line CL connected to the NAND gate N<00> is in a conductive state.

Figure 24:
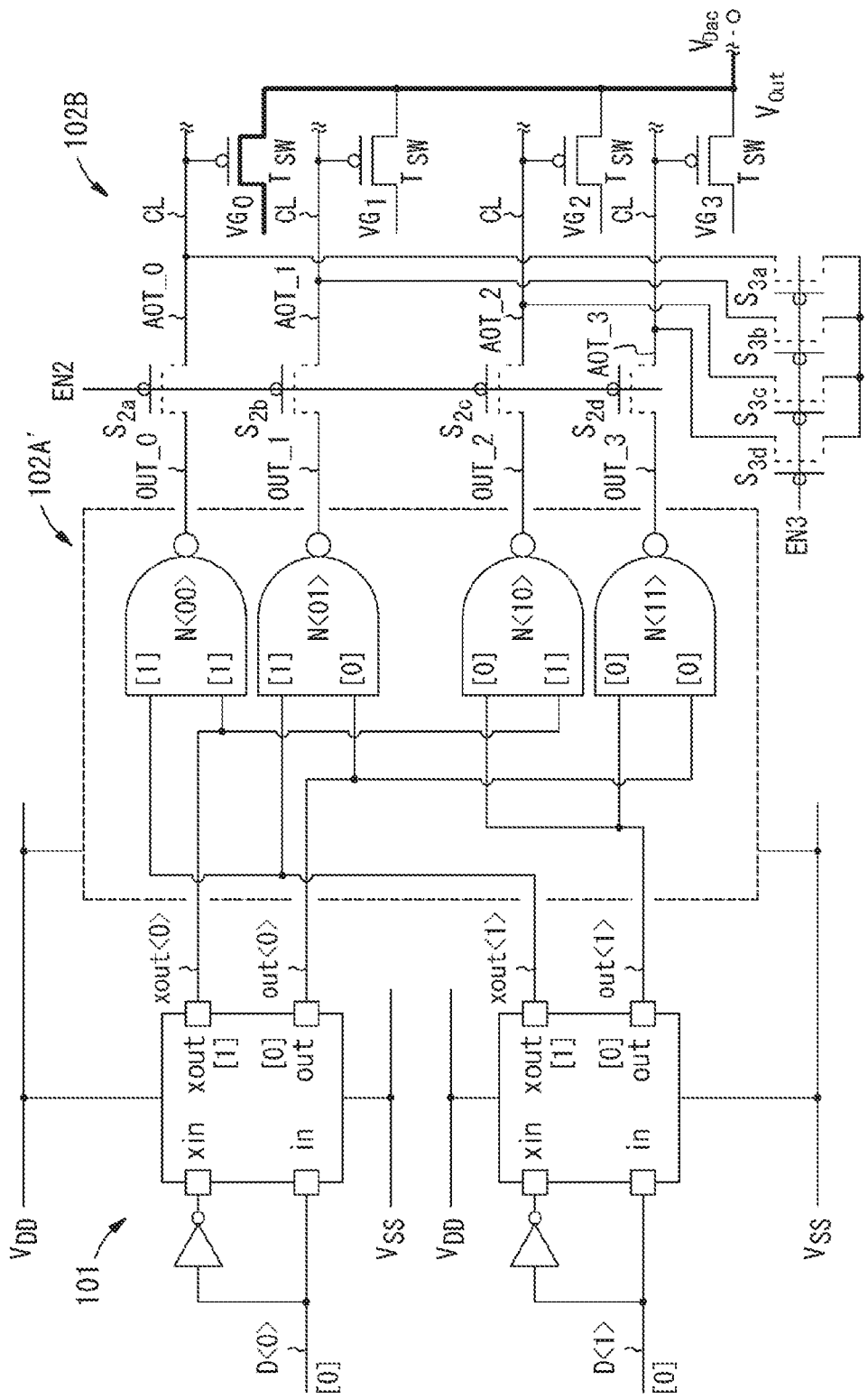
FIG. 24 is a schematic circuit diagram for describing an operation when the lower two bits of the video signal shift from [00] to [11] in an operation of the part performing signal processing of the lower two bits of the video signal in the source driver according to the second embodiment, subsequently to FIG. 23.
Figure 25:
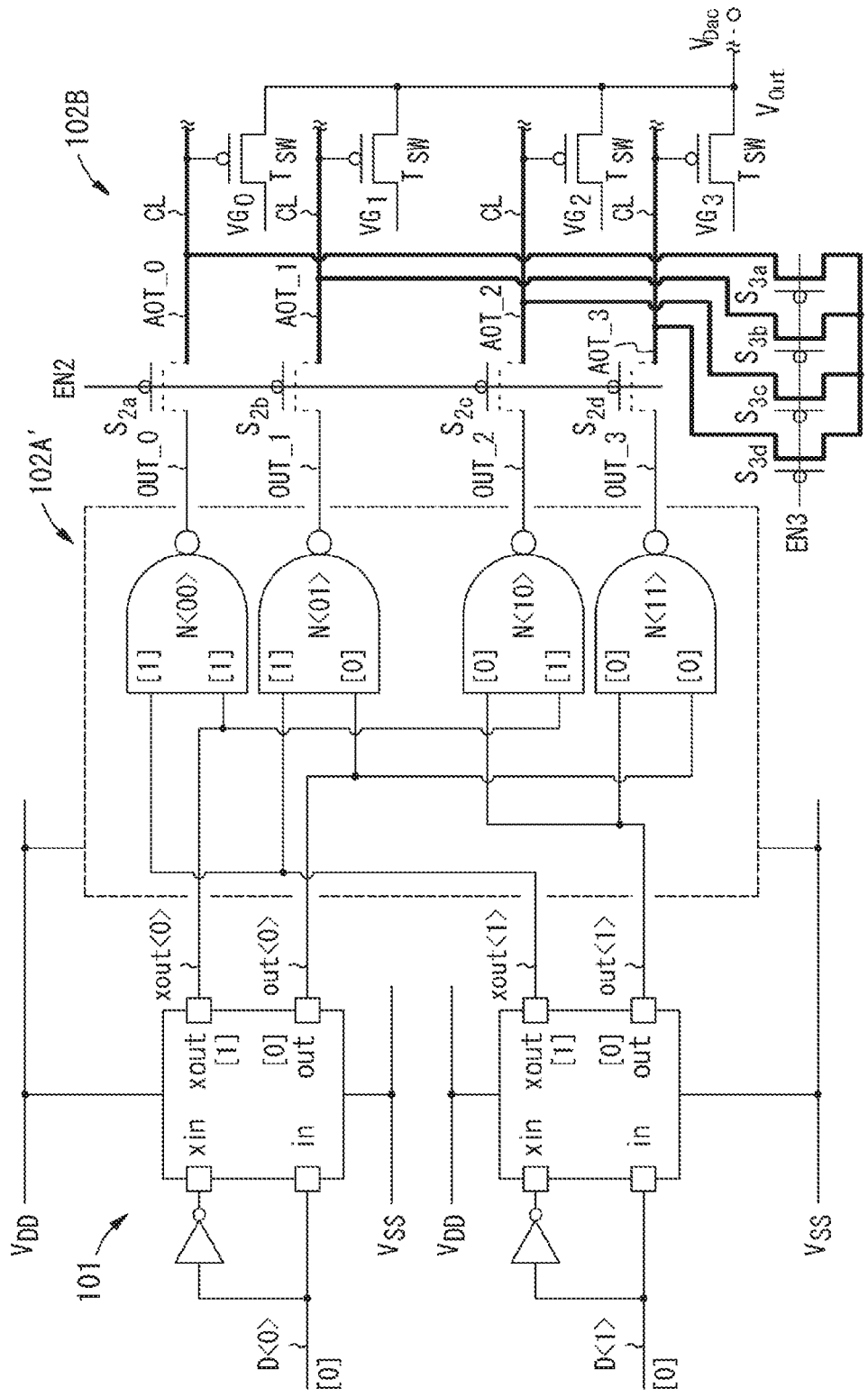
FIG. 25 is a schematic circuit diagram for describing an operation when the lower two bits of the video signal shift from [00] to [11] in an operation of the part performing signal processing of the lower two bits of the video signal in the source driver according to the second embodiment, subsequently to FIG. 24.

[Period B] (See FIG. 22 and FIG. 24)

While the lower two bits of the video signal are [00], the level of the control signal EN2 is switched from a low level to a high level. Accordingly, each of the second switching devices $S_2$ ($S_{2a}$, $S_{2b}$, $S_{2c}$, and $S_{2d}$) is in a non-conductive state. Each of the third switching devices $S_3$ ($S_{3a}$, $S_{3b}$, $S_{3c}$, and $S_{3d}$) maintains a non-conductive state. The connection between the output of the NAND gate and the control line CL is electrically disconnected. Since there is a capacitor component in the control line CL, each of the voltages AOT_0, AOT_1, AOT_2, and AOT_3 of the control line CL basically maintains the previous state. Specifically, the voltage AOT_0 is $V_{SS}$, and the voltages AOT_1, AOT_2, and AOT_3 are $V_{DD}$.

[Period C] (See FIGS. 22, 25, 26, and 27)

Subsequently, while the lower two bits of the video signal are [00], the level of the control signal EN3 is switched from a high level to a low level. Each of the third switching devices $S_3$ ($S_{3a}$, $S_{3b}$, $S_{3c}$, and $S_{3d}$) becomes in a conductive state. Each of the second switching devices $S_2$ ($S_{2a}$, $S_{2b}$, $S_{2c}$, and $S_{2d}$) maintains the non-conductive state (see FIG. 25).

As a result, while the connection between the output of the NAND gate and the control line CL is electrically disconnected, the control lines CL are conducted by the third switching devices $S_3$ ($S_{3a}$, $S_{3b}$, $S_{3c}$, and $S_{3d}$) and $S_{3d}$), and have the same voltage (potential). Basically, charges stored in the capacitor component of the control line CL in the period A are redistributed. Specifically, the voltages AOT_1, AOT_2, AOT_3, and AOT_4 each have a value of approximately (¾)×$V_{DD}$.

Figure 26:
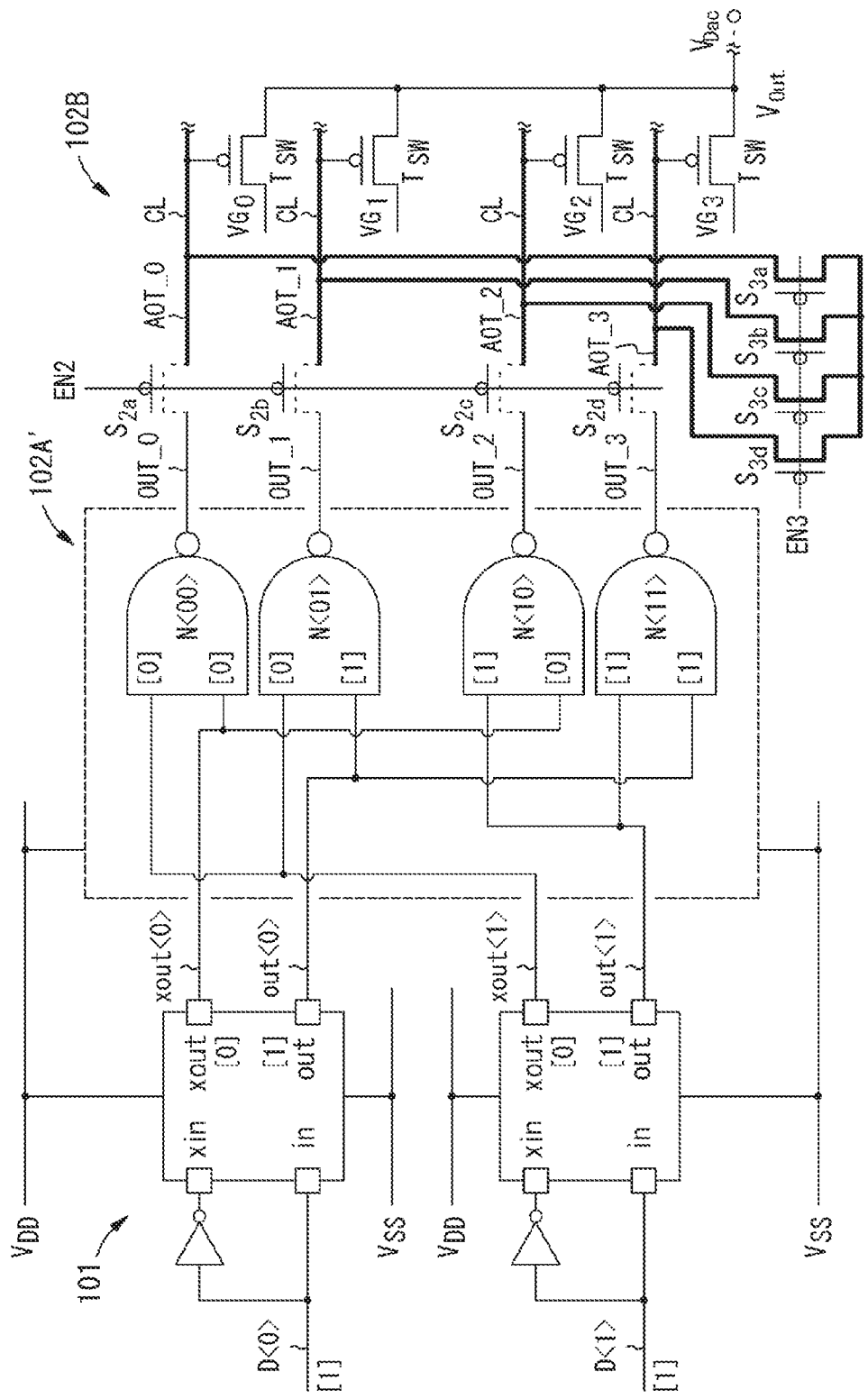
FIG. 26 is a schematic circuit diagram for describing an operation when the lower two bits of the video signal shift from [00] to [11] in an operation of the part performing signal processing of the lower two bits of the video signal in the source driver according to the second embodiment, subsequently to FIG. 25.
Figure 27:
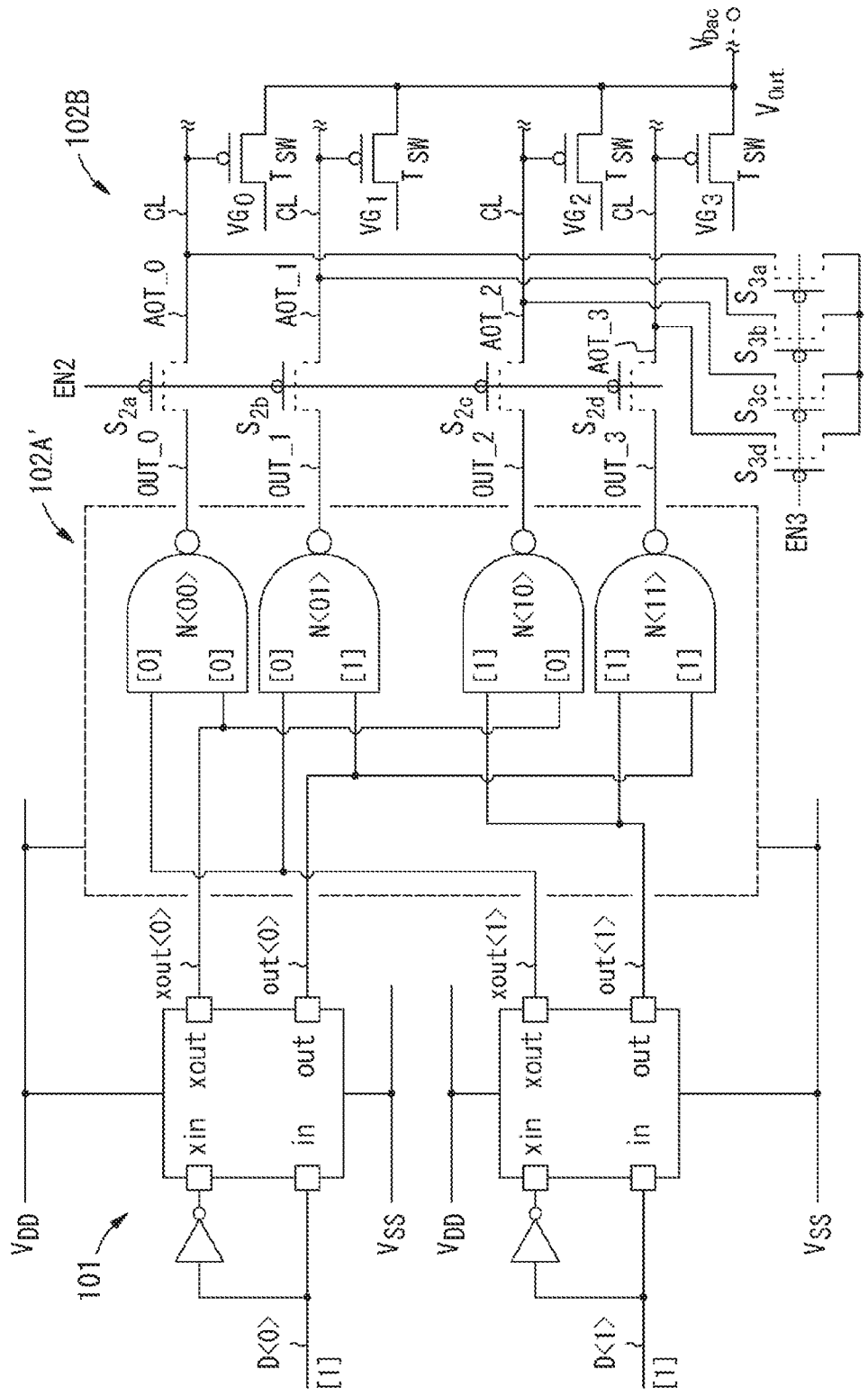
FIG. 27 is a schematic circuit diagram for describing an operation when the lower two bits of the video signal shift from [00] to [11] in an operation of the part performing signal processing of the lower two bits of the video signal in the source driver according to the second embodiment, subsequently to FIG. 26.

Subsequently, the lower two bits of the video signal shift from [00] to [11]. The output OUT_3 of the NAND gate N<11> is at a low level, and the outputs of other NAND gates are each at a high level (FIG. 26). After that, the level of the control signal EN3 is switched from a low level to a high level, and each of the third switching devices $S_3$ ($S_{3a}$, $S_{3b}$, $S_{3c}$, and $S_{3d}$) becomes in a non-conductive state. The second switching devices $S_2$ ($S_{2a}$, $S_{2b}$, $S_{2c}$, and $S_{2d}$) each maintain the non-conductive state (see FIG. 27).

Figure 28:
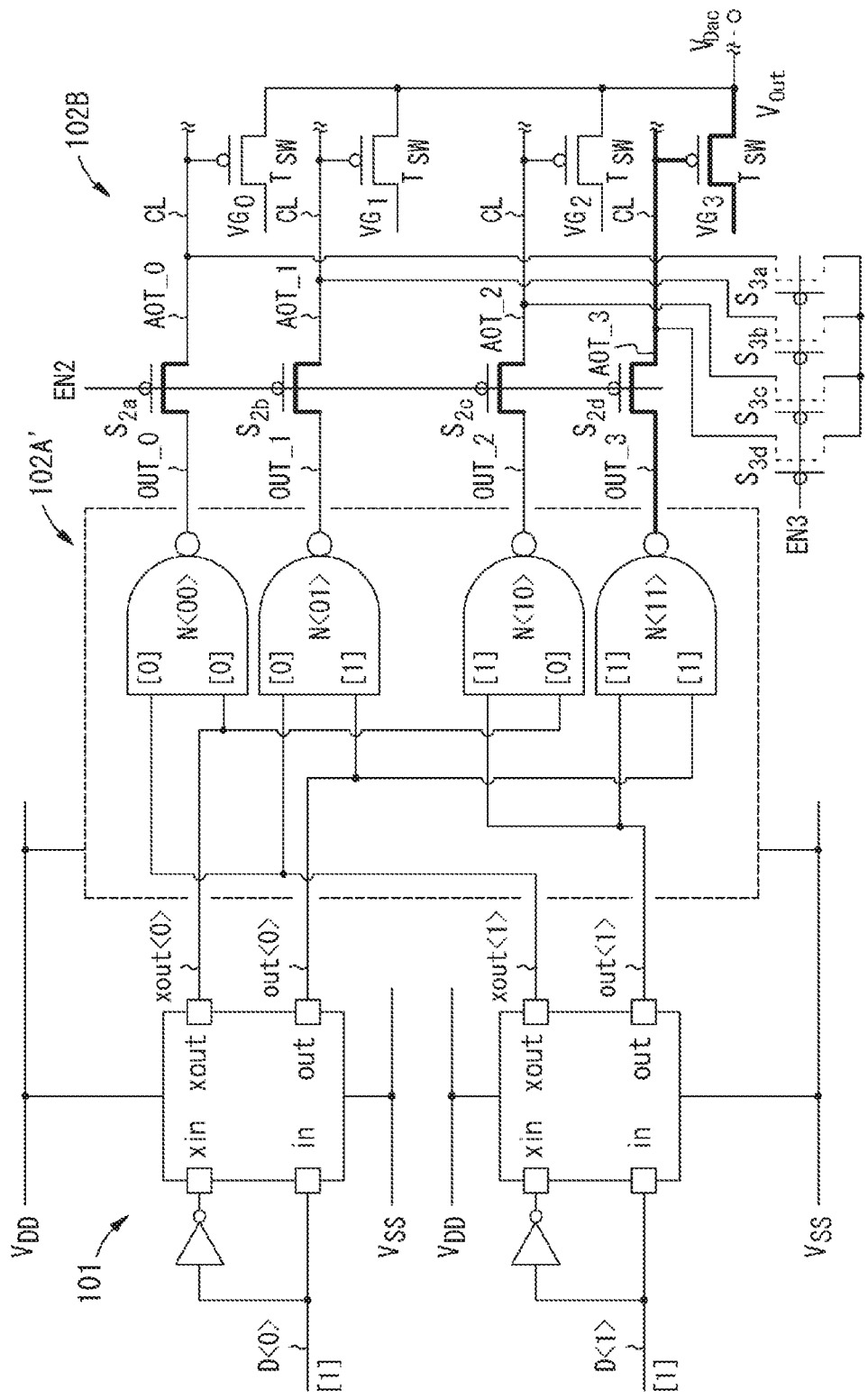
FIG. 28 is a schematic circuit diagram for describing an operation when the lower two bits of the video signal shift from [00] to [11] in an operation of the part performing signal processing of the lower two bits of the video signal in the source driver according to the second embodiment, subsequently to FIG. 27.

[Period D] (See FIG. 22 and FIG. 28)

While the lower two bits of the video signal are [11], the level of the control signal EN2 is switched from a high level to a low level. Accordingly, each of the third switching devices $S_3$ ($S_{3a}$, $S_{3b}$, $S_{3c}$, and $S_{3d}$) becomes in a conductive state. The second switching devices $S_2$ ($S_{2a}$, $S_{2b}$, $S_{2c}$, and $S_{2d}$) each maintain the non-conductive state.

The output OUT_3 of the NAND gate N<11> is at a low level, and the outputs of other NAND gates are each at a high level. Since the output of the NAND gate and the control line CL is electrically connected to each other, only the transistor that selects the voltage $VG_3$ by the control line CL connected to the NAND gate N<11> becomes a conductive state.

According to the above-mentioned operation, in the [period D], the voltages AOT_0, AOT_1, and AOT_2 shift from a state of being approximately (¾)×$V_{DD}$ to the voltage $V_{DD}$, and the voltage AOT_3 shifts from state of being approximately (¾) to the voltage $V_{SS}$. Since the width of the voltage change is reduced by approximately 25%, also the charging/discharging current $I_2$ is reduced by approximately 25%.

The control signals EN2 and EN3 only need to be generated in synchronization with the beginning of the horizontal scanning period of the display apparatus, for example. Note that in the case where bit information is unchanged although the video signal is rewritten, no charging/discharging current flows. Therefore, the above-mentioned control may be performed only when there is a difference from the bit information before rewriting.

Third Embodiment

The third embodiment also related to a digital/analog converter circuit, a source driver, and a display apparatus according to the first aspect of the present disclosure. Further, the third embodiment relates to the method of driving the digital/analog converter circuit according to the third aspect of the present disclosure.

The third embodiment is a combination of the first embodiment and the second embodiment. Accordingly, it is possible to reduce both the through current and the charging/discharging current.

In a schematic view of a display apparatus 1B according to the third embodiment, it is only necessary to consider the display apparatus 1 as a display apparatus 1B and consider the source driver 100 as a source driver 100E in FIG. 1.

Figure 29:
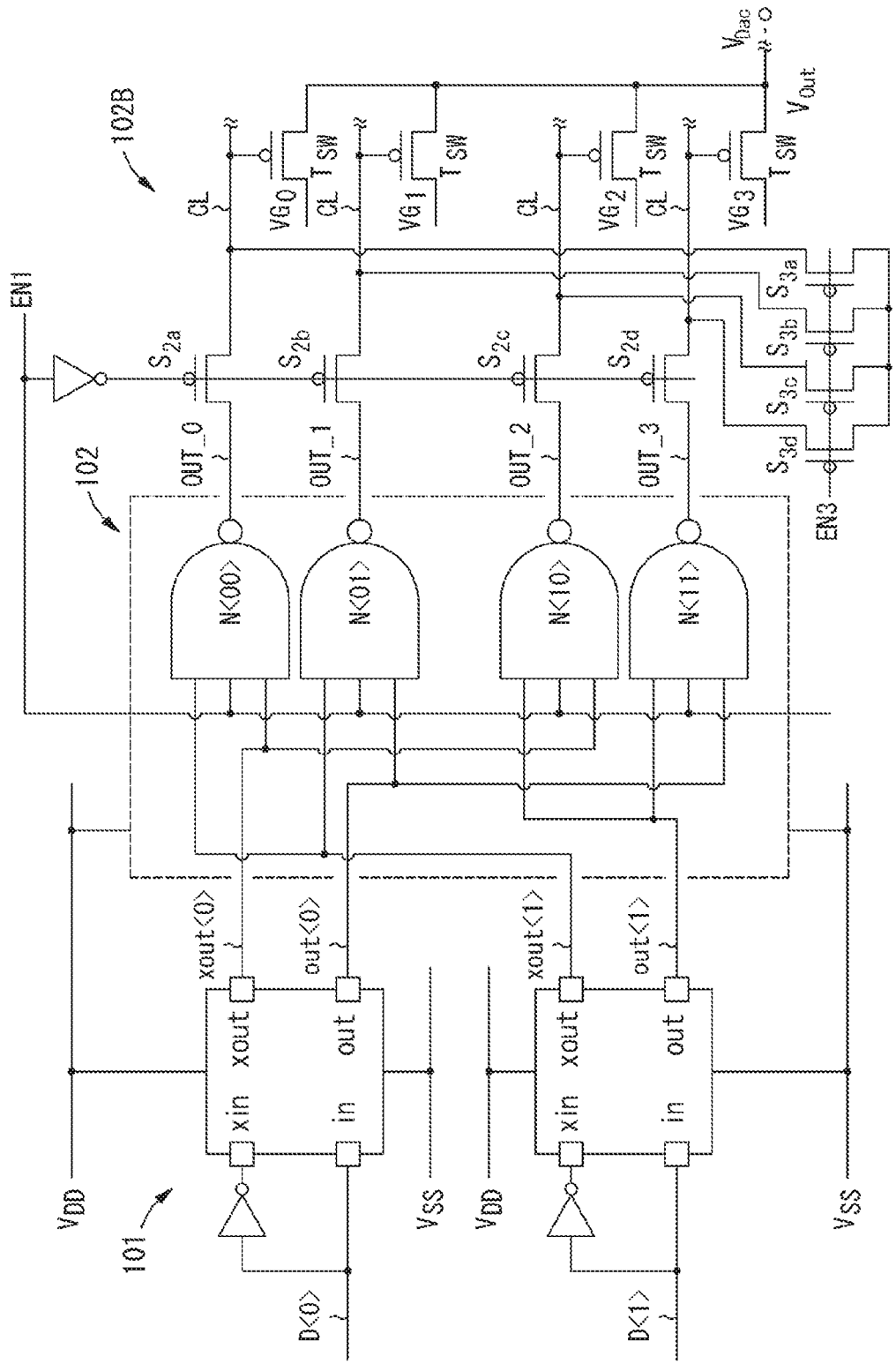
FIG. 29 is a schematic circuit diagram for describing a configuration of a part performing signal processing of the lower two bits of the video signal in a source driver according to a third embodiment.

FIG. 29 is a schematic circuit diagram for describing a configuration of the source driver according to the third embodiment. Note that similarly to FIG. 4, a configuration of the part of the source driver corresponding to the pixel group in the n'-th column is shown. For convenience of illustration, description of the amplifier circuit 103 and the distribution circuit 104 is omitted.

The method of driving the digital/analog converter circuit according to the third embodiment includes performing, when the output of the NAND gate transit, control of blocking the path between the power supply voltage side in the output circuit of the NAND gate and the ground voltage side, and short-circuiting the corresponding control line of the selector circuit while the output, unit of the decoding unit and the control line of the selector circuit are disconnected. The former control is similar to the control described in the first embodiment, and the latter control is similar to the control described in the second embodiment. Therefore, description thereof is omitted.

In this configuration, it is possible to control the third switching devices $S_3$ ($S_{3a}$, $S_{3b}$, $S_{3c}$, and $S_{3d}$) by using the control signal EN1 for suppressing the through current of the NAND gate. Note that in order to deal with the difference in the conductivity, it is only necessary to supply the control signal EN1 to the third switching devices $S_3$ via an inverting circuit.

[Electronic Apparatus]

The display apparatus of the present disclosure that has been described above can be used as a display unit (display apparatus) of an electronic apparatus in any filed, the display unit (display apparatus) displaying, as an image or a video, a video signal input to the electronic apparatus or a video signal generated within the electronic apparatus. By way of example, the display unit can be used as a display unit of a television set, a digital still camera, a lap-top personal computer, a portable terminal apparatus such as a mobile phone, a video camera, a head mounted display (head-mounted type display), or the like.

The display apparatus of the present disclosure includes a module-shaped display apparatus having a sealed configuration. By way of example, a display module that is formed by attaching a facing portion formed of transparent glass or the like to a pixel array unit corresponds to the display apparatus. Note that the display module may include a circuit unit for inputting/outputting signals or the like from the outside to the pixel array unit, a flexible printed circuit (FPC), or the like. Hereinafter, a digital still camera and a head mounted display are exemplified as specific examples of the electronic apparatus using the display apparatus of the present disclosure. It should be noted that the specific examples described herein are merely illustrative, and the present disclosure is not limited thereto.

Specific Example 1

FIG. 30 is an outer appearance view of a digital still camera of a lens-interchangeable and single-lens-reflex type, in which FIG. 30A shows a front view thereof and FIG. 30B shows a rear view thereof. The digital still camera of a lens-interchangeable and single-lens-reflex type includes, for example, an interchangeable imaging lens unit (interchangeable lens) 312 on the right side of the front of a camera main body portion. (camera body) 311, and a grip portion 313 to be gripped by a photographer on the left side of the front thereof.

Further, a monitor 314 is provided at substantially the center of the back of the camera main body portion 311. A viewfinder (eyepiece window) 315 is provided above the monitor 314. A photographer can visually recognize an optical image of a subject, which is derived from the imaging lens unit 312, and then determine the composition by looking through the viewfinder 315.

In the digital still camera of a lens-interchangeable and single-lens-reflex type having the configuration described above, the display apparatus of the present disclosure can be used as the viewfinder 315 of the digital still camera. In other words, the digital still camera of a lens-interchangeable and single-lens-reflex type according to this example is produced by using the display apparatus of the present disclosure as the viewfinder 315 of the digital still camera.

Specific Example 2

Figure 31:
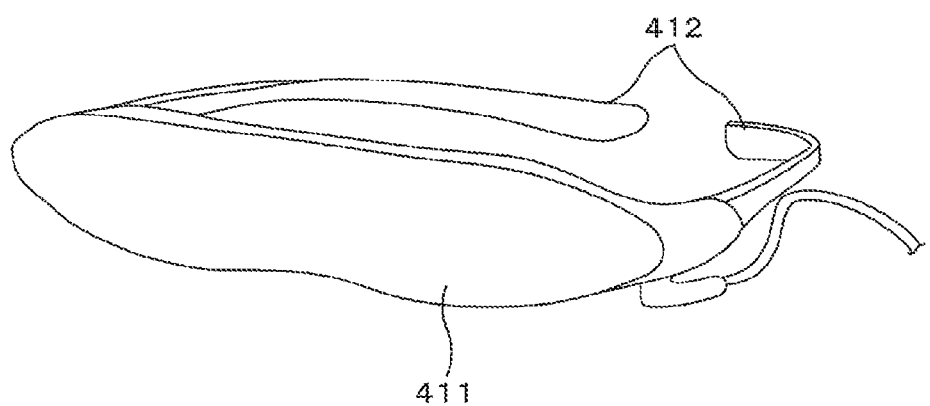
FIG. 31 is an outer appearance view of a head mounted display.

FIG. 31 is an outer appearance view of a head mounted display. The head mounted display includes, for example, temple portions 412 on the both sides of an eyeglass-shaped display unit 411. The temple portions 412 are used to be mounted to the head of a user. In this head mounted display, the display apparatus of the present disclosure can be used as the display unit 411 of the head mounted display. In other words, the head mounted display according to this example is produced by using the display apparatus of the present disclosure as the display unit 411 of the head mounted display.

Specific Example 3

Figure 32:
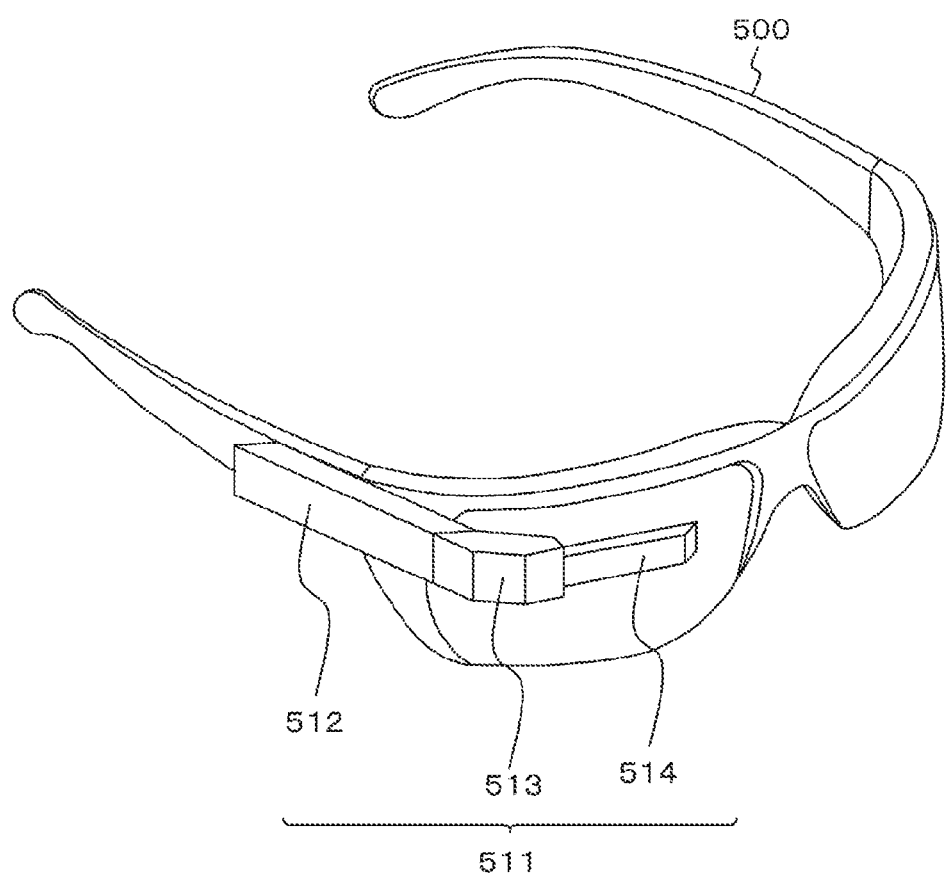
FIG. 32 an outer appearance view of a see-through head mounted display.

FIG. 32 is an outer appearance view of a see-through head mounted display. A see-through head mounted display 511 includes a main body portion 512, an arm 513, and a lens tube 514.

The main body portion 512 is connected to the arm 513 and eyeglasses 500. Specifically, the end portion of the main body portion 512 in the long-side direction is coupled to the arm 513, and one of the side surfaces of the main body portion 512 is coupled to the eyeglasses 500 via a connection member. It should be noted that the main body portion 512 may be directly mounted to the head of a human body.

The main body portion 512 incorporates a control board for controlling the operation of the see-through head mounted display 511, and a display unit. The arm 513 connects the main body portion 512 and the lens tube 514 to each other and supports the lens tube 514. Specifically, the arm 513 is coupled to the end portion of the main body portion 512 and the end portion of the lens tube 514 and fixes the lens tube 514. Further, the arm 513 incorporates a signal line for communication of data related to an image provided to the lens tube 514 from the main body portion 512.

The lens tube 514 projects image light, which is provided from the main body portion 512 via the arm 513, through an eyepiece lens toward the eyes of the user wearing the see-through head mounted display 511. In this see-through head mounted display 511, the display apparatus of the present disclosure can be used for the display unit of the main body portion 512.

[Others]

It should be noted that the technology of the present disclosure can also have the following configurations.

[A1]

A digital/analog converter circuit, including:

a decoding unit that performs decoding processing on a bit signal in a predetermined part of a digital signal; and a selector circuit that selects and outputs a voltage depending on an output of the decoding unit, in which a switching device is disposed on at least one of inside of the decoding unit and an output unit side of the decoding unit, the switching device being controlled by a control signal different from the bit signal as a target for the decoding processing.

[A2]

The digital/analog converter circuit according to [A1] above, in which the decoding unit includes a NAND gate, and a first switching device is connected in series to a path between a power supply voltage side in an output circuit of the NAND gate and a ground voltage side.

[A3]

The digital/analog converter circuit according to [A2] above, in which a pair of switching devices is disposed as the first switching device in the NAND gate, one of the pair of switching devices is connected in series to a part between an output end of the output circuit and the power supply voltage side, and the other of the pair of switching devices is connected in series to a part between the output end of the output circuit and the ground voltage side.

[A4]

The digital/analog converter circuit according to [A3] above, in which the pair of switching devices is controlled by the same control signal.

[A5]

The digital/analog converter circuit according to any one of [A2] to [A4] above, in which the decoding unit includes a plurality of units each including a pair of NAND gates capable of performing two bit processing, the plurality of units being arrayed in the decoding unit.

[A6]

The digital/analog converter circuit according to any one of [A2] to [A5] above, in which when an output of the NAND gate transits, the first switching device is controlled by the control signal to block the path between the power supply voltage side in the output circuit and the ground voltage side.

[A7]

The digital/analog converter circuit according to any one of [A1] to [A6] above, in which on the output unit side of the decoding unit, second switching devices and third switching devices are disposed corresponding to respective control lines of the selector circuit corresponding to the decoding unit, the output unit of the decoding unit is connected to the control line of the selector circuit corresponding to the decoding unit via the corresponding second switching device, and the control lines of the selector circuit are connected to each other via the third switching devices.

[A8]

The digital/analog converter circuit according to [A7] above, in which when the output of the decoding unit transits, each of the second switching devices and the third switching devices is controlled by the control signal to short-circuit the corresponding control line of the selector circuit while the output unit of the decoding unit and the control line of the selector circuit are disconnected.

[B1]

A source driver that is used for supplying a voltage corresponding to a gradation value given as a digital signal to a data line of a display unit, the source driver including:

a digital/analog converter circuit that selects and outputs the voltage corresponding to the gradation value, the digital/analog converter circuit including a decoding unit that performs decoding processing on a bit signal in a predetermined part of a digital signal, and a selector circuit that selects and outputs a voltage depending on an output of the decoding unit, in which a switching device is disposed on at least one of inside of the decoding unit and an output unit side of the decoding unit, the switching device being controlled by a control signal different from the bit signal as a target for the decoding processing.

[B2]

The source driver according to [B1] above, in which the decoding unit includes a NAND gate, and a first switching device is connected in series to a path between a power supply voltage side in an output circuit of the NAND gate and a ground voltage side.

[B3]

The source driver according to [B2] above, in which a pair of switching devices is disposed as the first switching device in the NAND gate, one of the pair of switching devices is connected in series to a part between an output end of the output circuit and the power supply voltage side, and the other of the pair of switching devices is connected in series to a part between the output end of the output circuit and the ground voltage side.

[B4]

The source driver according to [B3] above, in which the pair of switching devices is controlled by the same control signal.

[B5]

The source driver according to any one of [B2] to [B4] above, in which the decoding unit includes a plurality of units each including a pair of NAND gates capable of performing two bit processing, the plurality of units being arrayed in the decoding unit.

[B6]

The source driver according to any one of [B2] to [B5] above, in which when an output of the NAND gate transits, the first switching device is controlled by the control signal to block the path between the power supply voltage side in the output circuit and the ground voltage side.

[B7]

The source driver according to any one of [B1] to [B6] above, in which on the output unit side of the decoding unit, second switching devices and third switching devices are disposed corresponding to respective control lines of the selector circuit corresponding to the decoding unit, the output unit of the decoding unit is connected to the control line of the selector circuit corresponding to the decoding unit via the corresponding second switching device, and the control lines of the selector circuit are connected to each other via the third switching devices.

[B8]

The source driver according to [B7] above, in which
when the output of the decoding unit transits, each of the second switching devices and the third switching devices is controlled by the control signal to short-circuit the corresponding control line of the selector circuit while the output unit of the decoding unit and the control line of the selector circuit are disconnected.

[C1]

A display apparatus, including:
a display unit; and
a source driver that is used for supplying a voltage corresponding to a gradation value given as a digital signal to a data line of a display unit, the source driver including
 a digital/analog converter circuit that selects and outputs the voltage corresponding to the gradation value, the digital/analog converter circuit including
  a decoding unit that performs decoding processing on a bit signal in a predetermined part of a digital signal, and
  a selector circuit that selects and outputs a voltage depending on an output of the decoding unit, in which
a switching device is disposed on at least one of inside of the decoding unit and an output unit side of the decoding unit, the switching device being controlled by a control signal different from the bit signal as a target for the decoding processing.

[C2]

The display apparatus according to [C1] above, in which
the display unit and the source driver are integrally formed on a common semiconductor substrate.

[C3]

The display apparatus according to [C1] or [C2] above, in which
the decoding unit includes a NAND gate, and
a first switching device is connected in series to a path between a power supply voltage side in an output circuit of the NAND gate and a ground voltage side.

[C4]

The display apparatus according to [C3] above, in which
a pair of switching devices is disposed as the first switching device in the NAND gate,
one of the pair of switching devices is connected in series to a part between an output end of the output circuit and the power supply voltage side, and
the other of the pair of switching devices is connected in series to a part between the output end of the output circuit and the ground voltage side.

[C5]

The display apparatus according to [C4] above, in which
the pair of switching devices is controlled by the same control signal.

[C6]

The display apparatus according to any one of [C3] to [C5] above, in which
the decoding unit includes a plurality of units each including a pair of NAND gates capable of performing two bit processing, the plurality of units being arrayed in the decoding unit.

[C7]

The display apparatus according to any one of [C3] to [C6] above, in which
when an output of the NAND gate transits, the first switching device is controlled by the control signal to block the path between the power supply voltage side in the output circuit and the ground voltage side.

[C8]

The display apparatus according to any one of [C1] to [C7] above, in which
on the output unit side of the decoding unit, second switching devices and third switching devices are disposed corresponding to respective control lines of the selector circuit corresponding to the decoding unit,
the output unit of the decoding unit is connected to the control line of the selector circuit corresponding to the decoding unit via the corresponding second switching device, and
the control lines of the selector circuit are connected to each other via the third switching devices.

[C9]

The display apparatus according to [C8] above, in which
when the output of the decoding unit transits, each of the second switching devices and the third switching devices is controlled by the control signal to short-circuit the corresponding control line of the selector circuit while the output unit of the decoding unit and the control line of the selector circuit are disconnected.

[D1]

An electronic apparatus, including:
a display apparatus including
a display unit, and
a source driver that is used for supplying a voltage corresponding to a gradation value given as a digital signal to a data line of a display unit, the source driver including
 a digital/analog converter circuit that selects and outputs the voltage corresponding to the gradation value, the digital/analog converter circuit including
  a decoding unit that performs decoding processing on a bit signal in a predetermined part of a digital signal, and
  a selector circuit that selects and outputs a voltage depending on an output of the decoding unit, is which
a switching device is disposed on at least one of inside of the decoding unit and an output unit side of the decoding unit, the switching device being controlled by a control signal different from the bit signal as a target for the decoding processing.

[D2]

The electronic apparatus according to [D1] above, in which
the display unit and the source driver are integrally formed on a common semiconductor substrate.

[D3]

The electronic apparatus according to [D1] or [D2] above, in which
the decoding unit includes a NAND gate, and
a first switching device is connected in series to a path between a power supply voltage side in an output circuit of the NAND gate and a ground voltage side.

[D4]

The electronic apparatus according to [D3] above, in which
a pair of switching devices is disposed as the first switching device in the NAND gate, one of the pair of switching devices is connected in series to a part between an output end of the output circuit and the power supply voltage side, and the other of the pair of switching devices is connected in series to a part between the output end of the output circuit and the ground voltage side.

[D5]

The electronic apparatus according to [D4] above, in which the pair of switching devices is controlled by the same control signal.

[D6]

The electronic apparatus according to any one of [D3] to [D5] above, in which the decoding unit includes a plurality of units each including a pair of NAND gates capable of performing two bit processing, the plurality of units being arrayed in the decoding unit.

[D7]

The electronic apparatus according to any one of [D3] to [D6] above, in which when an output of the NAND gate transits, the first switching device is controlled by the control signal to block the path between the power supply voltage side in the output circuit and the ground voltage side.

[D8]

The electronic apparatus according to any one of [D1] to [D7] above, in which on the output unit side of the decoding unit, second switching devices and third switching devices are disposed corresponding to respective control lines of the selector circuit corresponding to the decoding unit, the output unit of the decoding unit is connected to the control line of the selector circuit corresponding to the decoding unit via the corresponding second switching device, and the control lines of the selector circuit are connected to each other via the third switching devices.

[D9]

The electronic apparatus according to [D8] above, in which when the output of the decoding unit transits, each of the second switching devices and the third switching devices is controlled by the control signal to short-circuit the corresponding control line of the selector circuit while the output unit of the decoding unit and the control line of the selector circuit are disconnected.

[E1]

A method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method including:

performing, when an output of the NAND gate transits, control of blocking a path between a power supply voltage side in an output circuit of the NAND gate and a ground voltage side.

[F1]

A method of driving a digital/analog converter circuit including a decoding unit that performs decoding processing on a bit signal in a predetermined part of a digital signal, and a selector circuit that selects and outputs a voltage depending on an output of the decoding unit, the method including:

performing, when the output of the decoding unit transits, control of short-circuiting a corresponding control line of the selector circuit while an output unit of the decoding unit and the control line of the selector circuit are disconnected.

[G1]

A method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method including:

performing, when an output of the NAND gate transits, control of blocking a path between a power supply voltage side in an output circuit of the NAND gate and a ground voltage side, and control of short-circuiting a corresponding control line of the selector circuit while an output unit of the decoding unit and the control line of the selector circuit are disconnected.

REFERENCE SIGNS LIST 1, 1A, 1B display apparatus
2 display unit
10 display device
20 semiconductor substrate
21 n-well
22 device separation area
31 gate insulating layer
31' insulating layer
32 gate electrode
32' other electrode
33 interlayer insulating layer
34 one electrode
35, 36 contact hole
37 wiring
40 interlayer insulating layer
51 anode electrode
52 hole transport layer, light-emitting layer, and electron transport layer
53 cathode electrode
54 second interlayer insulating layer
55, 56 contact hole
60 transparent substrate
100, 100A, 100B source driver
101 level shifter
102, 102' digital/analog converter circuit
102A, 102A' decoding unit
102B selector circuit
102S arrangement part of switching devices
103 amplifier circuit
104 distribution circuit
110 vertical scanner
120 power supply unit
$TR_W$ write transistor
$TR_D$ drive transistor
$C_S$ capacitor unit
ELP organic electroluminescence light-emitting unit
$C_{EL}$ capacitor of light-emitting unit ELP
$C_{sub}$ auxiliary capacitor
WS1 scanning line
DTL data line
PS1 feeder line
PS2 common feeder line
$S_{1a}$, $S_{1b}$ first switching device
$S_2$, $S_{2a}$, $S_{2b}$, $S_{2c}$, and $S_{2d}$ second switching device
$S_3$, $S_{3a}$, $S_{3b}$, $S_{3c}$, and $S_{3d}$ third switching device
CL control line
311 camera main body portion
312 imaging lens unit 313 grip portion
314 monitor
315 viewfinder
500 eyeglasses
511 see-through head mounted display
512 main body portion
513 arm
514 lens tube

The invention claimed is:

1. A digital/analog converter circuit, comprising:
a decoding unit that performs decoding processing on a bit signal in a predetermined part of a digital signal;
a selector circuit that selects and outputs a voltage depending on an output of the decoding unit; and
a first switching device configured to be controlled by a control signal different from the bit signal as a target for the decoding processing, wherein
the decoding unit includes a NAND gate, and
the first switching device is connected in series to a path between a power supply voltage side in an output circuit of the NAND gate and a ground voltage side.

2. The digital/analog converter circuit according to claim 1, wherein
a second switching device is disposed in series with the first switching device in the path,
the first switching device is connected in series to a part between an output end of the output circuit and the power supply voltage side, and
the second switching device is connected in series to a part between the output end of the output circuit and the ground voltage side.

3. The digital/analog converter circuit according to claim 2, wherein
the first and second switching devices are controlled by the same control signal.

4. The digital/analog converter circuit according to claim 1, wherein
the decoding unit includes a plurality of units each including a pair of NAND gates capable of performing two bit processing, the plurality of units being arrayed in the decoding unit.

5. The digital/analog converter circuit according to claim 1, wherein
when an output of the NAND gate transits, the first switching device is controlled by the control signal to block the path between the power supply voltage side in the output circuit and the ground voltage side.

6. The digital/analog converter circuit according to claim 1, wherein
on the output unit side of the decoding unit, a second switching device and a third switching device are disposed corresponding to respective control lines of the selector circuit corresponding to the decoding unit,
the output unit of the decoding unit is connected to the control line of the selector circuit corresponding to the decoding unit via the corresponding second switching device, and
the control lines of the selector circuit are connected to each other via the third switching device.

7. The digital/analog converter circuit according to claim 6, wherein
when the output of the decoding unit transits, the second switching device and the third switching device are controlled by the control signal to short-circuit the corresponding control line of the selector circuit while the output unit of the decoding unit and the control line of the selector circuit are disconnected.

8. A source driver that is used for supplying a voltage corresponding to a gradation value given as a digital signal to a data line of a display unit, the source driver comprising:
a digital/analog converter circuit that selects and outputs the voltage corresponding to the gradation value, the digital/analog converter circuit including
a decoding unit that performs decoding processing on a bit signal in a predetermined part of a digital signal, and
a selector circuit that selects and outputs a voltage depending on an output of the decoding unit, wherein
a switching device is configured to be controlled by a control signal different from the bit signal as a target for the decoding processing,
the decoding unit includes a NAND gate, and
the switching device is configured to perform, when an output of the NAND gate transits, control of blocking a path between a power supply voltage side in an output circuit of the NAND gate and a ground voltage side.

9. A display apparatus, comprising:
a display unit; and
a source driver that is used for supplying a voltage corresponding to a gradation value given as a digital signal to a data line of a display unit, the source driver including
a digital/analog converter circuit that selects and outputs the voltage corresponding to the gradation value, the digital/analog converter circuit including
a decoding unit that performs decoding processing on a bit signal in a predetermined part of a digital signal, and
a selector circuit that selects and outputs a voltage depending on an output of the decoding unit, wherein
a switching device is configured to be controlled by a control signal different from the bit signal as a target for the decoding processing,
the decoding unit includes a NAND gate, and
the switching device is configured to perform, when an output of the NAND gate transits, control of blocking a path between a power supply voltage side in an output circuit of the NAND gate and a ground voltage side.

10. The display apparatus according to claim 9, wherein the display unit and the source driver are integrally formed on a common semiconductor substrate.

11. An electronic apparatus, comprising:
a display apparatus including
a display unit, and
a source driver that is used for supplying a voltage corresponding to a gradation value given as a digital signal to a data line of a display unit, the source driver including
a digital/analog converter circuit that selects and outputs the voltage corresponding to the gradation value, the digital/analog converter circuit including
a decoding unit that performs decoding processing on a bit signal in a predetermined part of a digital signal, and
a selector circuit that selects and outputs a voltage depending on an output of the decoding unit, wherein
a switching device is configured to be controlled by a control signal different from the bit signal as a target for the decoding processing,
the decoding unit includes a NAND gate, and the switching device is configured to perform, when an output of the NAND gate transits, control of blocking a path between a power supply voltage side in an output circuit of the NAND gate and a ground voltage side.

12. A method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method comprising:
performing, when an output of the NAND gate transits, control of blocking a path between a power supply voltage side in an output circuit of the NAND gate and a ground voltage side.

13. A method of driving a digital/analog converter circuit including a decoding unit that performs decoding processing on a bit signal in a predetermined part of a digital signal, and a selector circuit that selects and outputs a voltage depending on an output of the decoding unit, the method comprising:
performing, when the output of the decoding unit transits, control of short-circuiting a corresponding control line of the selector circuit while an output unit of the decoding unit and the control line of the selector circuit are disconnected.

14. A method of driving a digital/analog converter circuit including a decoding unit including a NAND gate that performs decoding processing on a bit signal in a predetermined part of a digital signal, and a selector circuit that selects and outputs a voltage depending on an output of the decoding unit, the method comprising:
performing, when an output of the NAND gate transits, control of blocking a path between a power supply voltage side in an output circuit of the NAND gate and a ground voltage side, and control of short-circuiting a corresponding control line of the selector circuit while an output unit of the decoding unit and the control line of the selector circuit are disconnected.

* * * * *